(12) United States Patent
Li

(10) Patent No.: US 12,363,884 B2
(45) Date of Patent: Jul. 15, 2025

(54) THREE-DIMENSIONAL MEMORY DEVICE WITH CAPACITORS AND VERTICAL WORD-LINE

(71) Applicant: CHANGXIN MEMORY TECHNOLOGIES, INC., Hefei (CN)

(72) Inventor: Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 563 days.

(21) Appl. No.: 17/752,078

(22) Filed: May 24, 2022

(65) Prior Publication Data

US 2023/0225107 A1 Jul. 13, 2023

Related U.S. Application Data

(63) Continuation of application No. PCT/CN2022/077910, filed on Feb. 25, 2022.

(30) Foreign Application Priority Data

Jan. 10, 2022 (CN) .......................... 202210022380.3

(51) Int. Cl.
H10B 12/00 (2023.01)

(52) U.S. Cl.
CPC ........... *H10B 12/30* (2023.02); *H10B 12/038* (2023.02); *H10B 12/482* (2023.02); *H10B 12/488* (2023.02)

(58) Field of Classification Search
CPC .... H10B 12/30; H10B 12/038; H10B 12/482; H10B 12/488; H10B 12/03
See application file for complete search history.

(56) References Cited

U.S. PATENT DOCUMENTS

| 10,714,400 B2 | 7/2020 | Torek |
| 11,233,060 B2 | 1/2022 | Lee et al. |
| 11,335,687 B2 | 5/2022 | Lee |

(Continued)

FOREIGN PATENT DOCUMENTS

| CN | 1127135 C | 11/2003 |
| CN | 101997000 B | 7/2012 |

(Continued)

OTHER PUBLICATIONS

First Office Action of the Chinese application No. 202210022380.3, mailed on Feb. 16, 2022, 15 pages.

(Continued)

*Primary Examiner* — Herve-Louis Y Assouman
(74) *Attorney, Agent, or Firm* — Kilpatrick Townsend & Stockton LLP

(57) ABSTRACT

A semiconductor structure includes a substrate; at least one layer of memory structure formed on the substrate, in which each layer of memory structure comprises a bit line structure and a plurality of capacitor structures symmetrically distributed on both sides of the bit line structure, the plurality of capacitor structures and the bit line structure extend in a first direction parallel to the substrate surface; a plurality of word line structures formed in the at least one layer of memory structure, which pass through the at least one layer of memory structure and extend in a second direction perpendicular to the substrate surface.

14 Claims, 16 Drawing Sheets

(56) References Cited

U.S. PATENT DOCUMENTS

| | | | |
|---|---|---|---|
| 2018/0323200 A1* | 11/2018 | Tang | H10B 12/48 |
| 2019/0103407 A1* | 4/2019 | Kim | H10B 12/30 |
| 2019/0164985 A1* | 5/2019 | Lee | H10D 1/714 |
| 2020/0083225 A1 | 3/2020 | Ma et al. | |
| 2020/0227416 A1 | 7/2020 | Lilak et al. | |
| 2021/0249415 A1 | 8/2021 | Kang et al. | |

FOREIGN PATENT DOCUMENTS

| | | |
|---|---|---|
| CN | 110890371 A | 3/2020 |
| CN | 110896074 A | 3/2020 |
| CN | 111052378 A | 4/2020 |
| CN | 111435661 A | 7/2020 |
| CN | 112216696 A | 1/2021 |
| CN | 113206091 A | 8/2021 |
| CN | 113284897 A | 8/2021 |
| CN | 113903709 A | 1/2022 |
| CN | 113903735 A | 1/2022 |
| CN | 114023744 A | 2/2022 |

OTHER PUBLICATIONS

Notice of Allowance of the Chinese application No. 202210022380.3, mailed on Feb. 26, 2022, 6 pages.

* cited by examiner (a)

(b)

(c)

(a)

(b)

(c)

THREE-DIMENSIONAL MEMORY DEVICE WITH CAPACITORS AND VERTICAL WORD-LINE

CROSS-REFERENCE TO RELATED APPLICATION

This disclosure is a continuation application of International Application No. PCT/CN2022/077910, filed on Feb. 25, 2022, which claims priority to Chinese Patent Application No. 202210022380.3, filed on Jan. 10, 2022 and entitled "SEMICONDUCTOR STRUCTURE, PREPARATION METHOD OF SEMICONDUCTOR STRUCTURE AND SEMICONDUCTOR MEMORY". The disclosures of International Application No. PCT/CN2022/077910 and Chinese Patent Application No. 202210022380.3 are hereby incorporated by reference in their entireties.

BACKGROUND

At present, Dynamic Random Access Memory (DRAM) is usually manufactured with 2 Dimension (2D) structure, and the sizes of bit lines, word lines and transistors are reduced to increase the number of elements of 1 transistor and 1 capacitor (1T1C) to meet the needs of the next generation memory. However, the size reduction of these elements has reached the shrinkage limit, resulting in the storage density of the memory being limited.

SUMMARY

The disclosure relates to, but is not limited to, a semiconductor structure, a preparation method of the semiconductor structure, and a semiconductor memory.

In the first aspect, the embodiments of the disclosure provide a semiconductor structure including: a substrate; at least one layer of memory structure formed on the substrate and a plurality of word line structures formed in the at least one layer of memory structure.

Each layer of the memory structure includes a bit line structure and a plurality of capacitor structures symmetrically distributed on both sides of the bit line structure, and the capacitor structures and the bit line structure extend in a first direction which is parallel to the substrate surface.

The word line structures pass through the at least one layer of memory structure, and extend in a second direction which is perpendicular to the substrate surface.

In the second aspect, the embodiments of the disclosure provide a method for preparing a semiconductor structure, which includes the following steps.

A substrate is provided.

At least one layer of memory structure is formed on the substrate, in which each layer of the memory structure includes a bit line structure and a plurality of capacitor structures symmetrically distributed on both sides of the bit line structure, and the capacitor structures and the bit line structure extend in a first direction which is parallel to the substrate surface.

A plurality of word line structures are formed in the at least one layer of memory structure, and the word line structures pass through the at least one layer of memory structure and extend in a second direction which is perpendicular to the substrate surface.

In the third aspect, the embodiments of the disclosure provide a semiconductor memory at least including the semiconductor structure as described in the first aspect.

DETAILED DESCRIPTION

Figure 1:
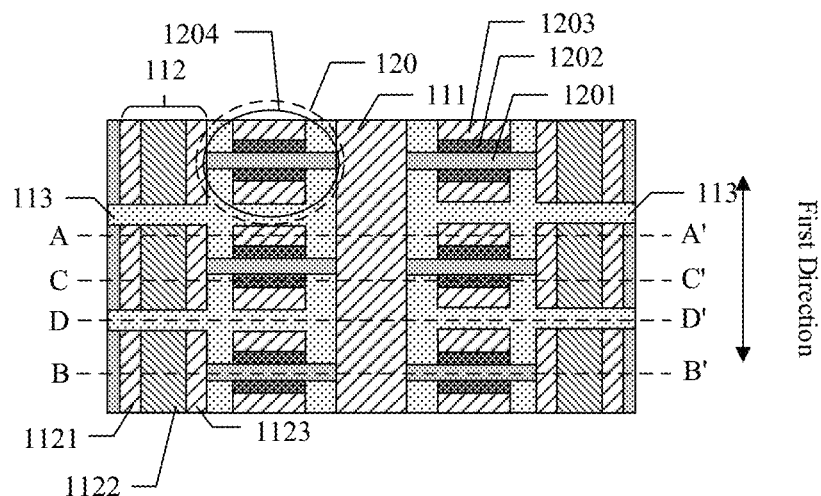
FIG. 1 is a top view scheme diagram of a semiconductor structure provided by an embodiment of the disclosure.

Technical solution in the embodiments of the disclosure will be clearly and fully described below in combination with the accompanying drawings in the embodiment of the disclosure. It is to be understood that the specific embodiments described herein is intended only to explain the relevant disclosure and not to limit the same. In addition it should be noted that for convenience of description only portions related to the relevant disclosure are shown in the drawings.

Unless otherwise defined, all technical and scientific terms used herein have the same meanings as are commonly understood by those skilled in the art of the disclosure. The terminology used herein is for the purpose of describing the embodiments of the disclosure only and is not intended to limit the disclosure.

In the following description, "some embodiments" is referred to, which describes a subset of all possible embodiments, but it is understood that "some embodiments" can be the same subset or different subsets of all possible embodiments, and can be combined with each other without conflict.

It should be pointed out that, the terms "first\ second\ third" referred to in the embodiments of this disclosure is merely used to distinguish similar objects, and does not represent a particular ordering of objects. It is understood that the "first\ second\ third" may be interchanged in a particular order or sequence such that it is permissible to enable the embodiments of the disclosure described herein to be implemented in an order other than that illustrated or described herein.

In a current memory structure (such as DRAM), the sizes of bit lines, word lines, transistors and capacitors per unit area have reached the shrinkage limits, which is difficult to meet the requirements of the next generation memory. Therefore, it is necessary to provide a new structure to increase the number of 1T1C elements in the memory and increase the storage density of the memory.

Based on this, the embodiments of the disclosure provide a semiconductor structure including: a substrate; at least one layer of memory structure formed on the substrate, in which each layer of the memory structure includes a bit line structure and multiple capacitor structures symmetrically distributed on both sides of the bit line structure, and the multiple capacitor structures and the bit line structure extend in a first direction parallel to the substrate surface; and multiple word line structures formed in the at least one layer of memory structure, which pass through the at least one layer of memory structure, and extend in a second direction perpendicular to the substrate surface. As such, multiple layers of memory structures may be included in the semiconductor structure, where in each layer of the memory structure, multiple capacitor structures are symmetrically distributed on both sides of the bit line structure, and the extending direction of the multiple capacitor structures and the bit line structure is parallel to the substrate surface; and in the at least one layer of memory structure, multiple word line structures are formed, and the extending directions of multiple word line structures are perpendicular to the plane of the substrate, thereby forming a 3D stack with the word line structures, the bit line structure and the capacitor structures to obtain the semiconductor structure with a 3D structure. In addition, each word line structure includes a channel layer in a transistor, that is, the number of the word line structures is equivalent to the number of the transistors, and the number of the capacitor structures is the number of capacitors. Such 3D structure can increase the number of capacitor structures and word line structures in the semiconductor structure, that is, increase the number of 1T1C elements per unit area in the semiconductor structure, and further increase the storage density of the semiconductor structure.

The embodiments of the disclosure will be described in detail below with reference to the accompanying drawings.

Figure 2:
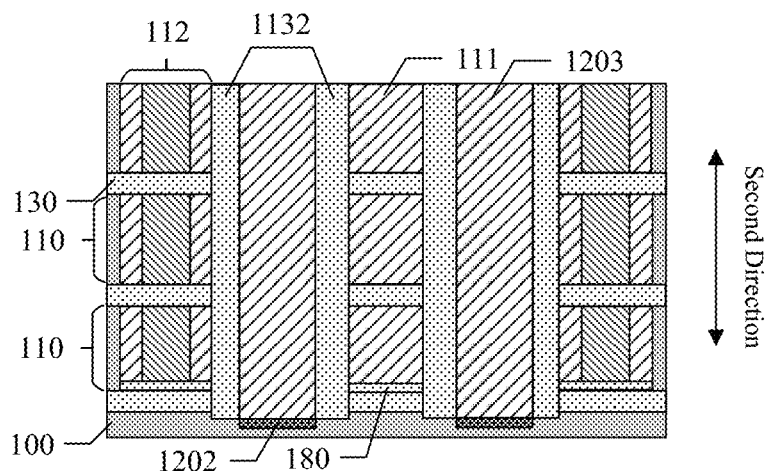
FIG. 2 is a front view scheme diagram I of a semiconductor structure provided by an embodiment of the disclosure.
Figure 3:
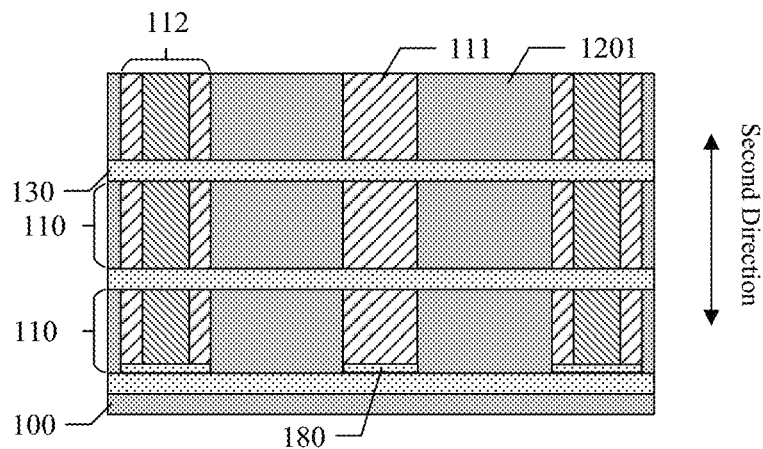
FIG. 3 is a front view scheme diagram II of a semiconductor structure provided by an embodiment of the disclosure.
Figure 4:
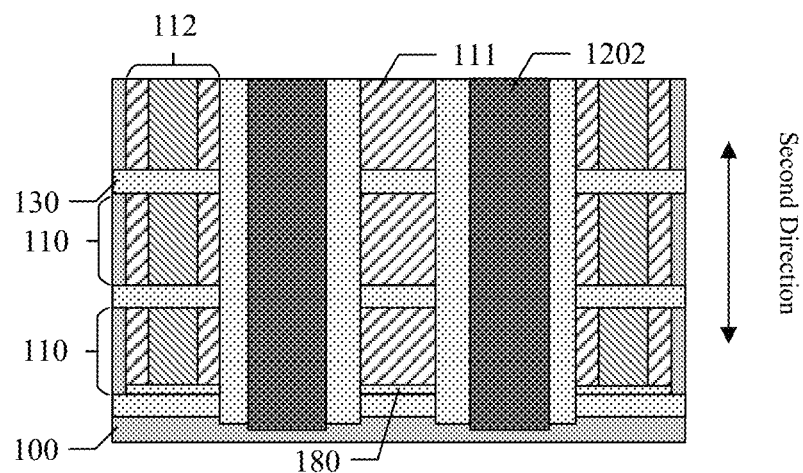
FIG. 4 is a front view scheme diagram III of a semiconductor structure provided by an embodiment of the disclosure.

In an embodiment of the disclosure, referring to FIGS. 1, 2, 3, and 4, FIG. 1 shows a top scheme diagram of a semiconductor structure provided by the embodiment of the disclosure, FIG. 2 shows a front view scheme diagram I of the semiconductor structure provided by the embodiment of the disclosure, FIG. 3 shows a front view scheme diagram II of the semiconductor structure provided by the embodiment of the disclosure, and FIG. 4 shows a front view scheme diagram III of the semiconductor structure provided by the embodiment of the disclosure. FIG. 2 is the cross-section front view in the AA' direction of FIG. 1, FIG. 3 is the cross-section front view in the BB' direction of FIG. 1, and FIG. 4 is the cross-section front view in the CC' direction of FIG. 1.

As shown in FIGS. 1 to 4, the semiconductor structure may include: a substrate 100; at least one layer of memory structure 110 formed on the substrate 100; and multiple word line structures 120 formed in the at least one layer of memory structure 110.

Each layer of the memory structure 110 includes a bit line structure 111 and multiple capacitor structures 112 symmetrically distributed on both sides of the bit line structure 111, and the bit line structure 111 and the multiple capacitor structures 112 extend in a first direction parallel to the surface of the substrate 100.

The multiple word line structures 120 pass through the at least one layer of memory structure 110, and extend in a second direction perpendicular to the surface of the substrate 100.

It should be noted that the substrate 100 may be a silicon substrate or other suitable substrate material such as silicon, germanium, silicon germanium compounds or the like, such as doped or undoped monocrystalline silicon substrate, polysilicon substrate or the like, which is not specifically limited.

As shown in FIGS. 2 to 4, at least one layer of memory structure 110 is sequentially formed above the substrate 100. In the drawings of the embodiments of the disclosure, exemplary description is given with three layers of memory structures 110, but in practical applications, more or less memory structures 110 may be formed.

As shown in FIG. 1, each layer of the memory structure 110 includes a bit line structure 111 and multiple capacitor structures 112 which are symmetrically distributed on both sides of the bit line structure 111. The extension direction of the bit line structure 111 and multiple capacitor structures 112 are in the first direction that is parallel to the plane of the substrate 100.

That is, each layer of memory structure 110 includes at least one bit line structure 111 and at least one pair of capacitor structures 112 symmetrically distributed on both sides of the bit line structure 111. Thus, in each layer of memory structure 110, both the number of bit line structures 111 and the number of capacitor structures 112 may be two or more, and the number of the capacitor structures 112 is even larger. In addition, since the number of layers of memory structures 110 is at least one layer, that is, in the semiconductor structure, two or more layers of memory structures 110 (for example, three layers shown in FIG. 3) may be formed, the number of bit line structures 111 and the number of capacitor structures 112 in the semiconductor structure can be increased, so as to improve the memory capacity of the semiconductor structure.

It should also be noted that, for each layer of memory structure, as shown in the first layer of memory structure 110 (which refers to the memory structure 110 directly formed on the substrate 100) in FIGS. 2 to 4, a third isolation structure 180 may also be included in the memory structure 110. That is, for each layer of memory structure, just as the first layer of memory structure 110, it may include a third isolation structure 180 at the bottom, alternatively, just as the second layer of memory structure 110 and the third layer of memory structure 110, it may not include a third isolation structures 180, which is not specifically limited herein.

The material of the third isolation structures 180 may be a low dielectric constant (low k) material, in which the low k material is an insulating material. The formation of a layer of low k material between the memory structures 110 as the third isolation structures 180 can reduce the parasitic capacitance between the wires in the semiconductor structure and mitigate the crosstalk between the signals, thereby playing a good isolation role.

It should also be noted that the word line structures 120 are formed in the at least one layer of memory structure 110 and pass through the same, and the extending direction (the second direction) of the word line structures 120 is perpendicular to the surface of the substrate 100. That is, the extending direction of the word line structures 120 and the extending direction of the bit line structure 111 are perpendicular to each other. In this way, compared with the traditional memory structure, the word line structures 120 are arranged to extend vertically, so that a 3D structure is formed between the devices such as the word line structures 120, the bit line structure 111 and the capacitor structures 112, thereby increasing the memory density of the semiconductor structure.

In some embodiments, the semiconductor structure further includes a first isolation structure 1131 and a second isolation structure 1132 formed in the at least one layer of memory structure 110, in which the first isolation structure 1131 is configured to isolate the multiple capacitor structures 112 and the second isolation structure 1132 is configured to isolate the multiple word line structures 120.

Figure 5:
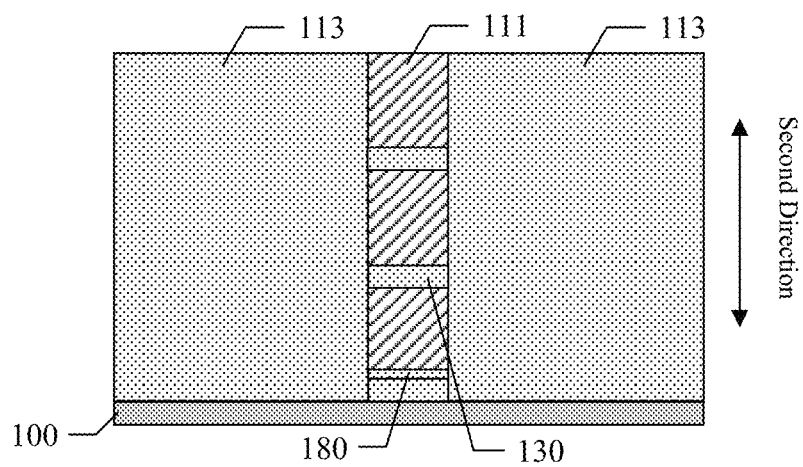
FIG. 5 is a front view scheme diagram IV of a semiconductor structure provided by an embodiment of the disclosure.
Figure 6:
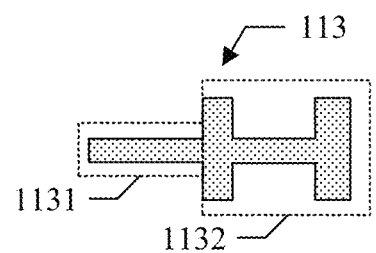
FIG. 6 is a top view scheme diagram of an isolation structure provided by the embodiments of the disclosure.
Figure 7:
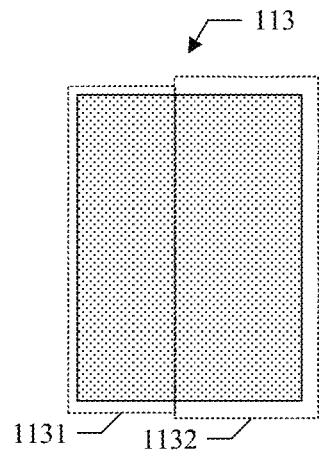
FIG. 7 is a front view scheme diagram of an isolation structure provided by an embodiment of the disclosure.

It should be noted that, as shown in FIG. 1, the first isolation structure 1131 and the second isolation structure 1132 is referred to as an isolation structure 113 as a whole. To more clearly show the first isolation structure 1131 and the second isolation structure 1132, FIGS. 5 to 7 may be referred to. FIG. 5 shows a front view scheme diagram IV of a semiconductor structure provided by the embodiment of the disclosure, which is a cross-section front view in the DD' direction of FIG. 1; FIG. 6 shows a top view scheme diagram of the isolation structure 113 provided by the embodiment of the disclosure, which represents the isolation structure 113 on the left side in FIG. 1; and FIG. 7 shows a front view scheme diagram of the isolation structure 113 provided by the embodiment of the disclosure, which represents the isolation structure 113 on the left side in FIG. 5.

As shown in FIG. 6, the first isolation structure 1131 is a "-" shaped portion on the left side of the isolation structure 113, and the second isolation structure 1132 is an "H" shaped portion on the right side of the isolation structure 113; Accordingly, for the right isolation structure 113 in FIG. 1, the first isolation structure 1131 is a "-" shaped portion on the right side of the isolation structure 113, and the second isolation structure 1132 is an "H" shaped portion on the left side of the isolation structure 113.

The material of the first isolation structure 1131 and the second isolation structure 1132 may also be a low k material, which provides good isolation between the bit line structures 111 and the capacitor structures 112. Therefore, in the drawings of the embodiment of the disclosure, the first isolation structures 1131 the second isolation structures 1132 and the third isolation structures 180 are represented in the same filling pattern.

Thus, for each layer of memory structure 110, multiple capacitor structures 112 are isolated by the first isolation structures 1131 and multiple word line structures 120 are isolated by the second isolation structures 1132. Thus, by the isolation of the first isolation structures 1131 and the second isolation structures 1132, the number of the bit line structures 111 and the number of the capacitor structures 112 are effectively increased.

As shown in FIG. 7, in the DD' direction, the first isolation structure 1131 and the second isolation structure 1132 are not clearly distinguished, and the first isolation structure 1131 and the second isolation structure 1132 pass through all the memory structures 110 in the second direction, thereby achieving isolation of the bit line structure 111 and the capacitor structures 112 in each layer of the memory structure 110. As such, the multiple bit line structures 111 and the capacitor structures 112 can be formed in each layer of the memory structure 110, to increase the memory density of the semiconductor structure.

In some embodiments, as shown in FIG. 1, the multiple word line structures 120 include multiple gate structures 1204, which include multiple channel layers 1201, multiple gate dielectric layers 1202, and multiple gate conductive layers 1203.

The multiple channel layers 1201 electrically respectively connect to the multiple capacitor structures 112 and the multiple bit line structures 111 through sources and drains;

The multiple gate dielectric layers 1202 are located on partial surfaces of the multiple channel layers 1201;

The multiple gate conductive layers 1203 are located on partial surfaces of the multiple gate dielectric layers 1202.

It should be noted that, as shown in FIG. 1, the multiple word line structures 120 may include multiple gate structures 1204. In the structure as shown in FIG. 1, each gate structure 1204 may represent one word line structure 120. The multiple gate structures 1204 may include multiple channel layers 1201, multiple gate dielectric layers 1202 and multiple gate conductive layers 1203. More specifically, each gate structure 1204, as shown in FIG. 1, may include a channel layer 1201, a gate dielectric layer 1202 distributed on the outer circumference of the channel layer 1201, and a gate conductive layer 1203 distributed on the outer circumference of the channel layer 1201, and the gate dielectric layer 1202 is located between the channel layer 1201 and the gate conductive layer 1203 on the outer circumference side of the channel layer 1201.

The multiple channel layers 1201 may be electrically connected to the multiple capacitor structures 112 and the multiple bit line structures 111 through sources or drains, respectively. For example, in FIG. 1 the sources may be located on the left sides of the channel layers 1201, and the channel layers 1201 respectively connect to the capacitor structures 112 on the left by the sources. The drains may be located on the right sides of the channel layers 1201, and the channel layers 1201 respectively connect to the bit line structure 111 through the drains on the right sides.

The material forming the channel layers 1201 may be silicon, such as P-type doped silicon or N-type doped silicon, that is, the material of the channel layers 1201 and the material of the substrate 100 may be the same, so that the channel layers 1201 and the substrate 100 may be represented in the same filling pattern in the drawings. However, the channel layers 1201 and the substrate 100 may also be formed of any suitable material, which may be the same or different and not specifically limited herein. In other embodiments, the channel layers 1201 may be strain layers, to improve the mobility of carriers in the channel layers 1201, for example, the material of the channel layers 1201 may be silicon germanium.

A gate dielectric layer 1202 may be formed on a partial surface of a channel layer 1201 by oxidation growth, that is, the gate dielectric layer 1202 is formed by oxidation growth on the surface of the channel layer 1201, and the material of the gate dielectric layer 1202 may include silicon oxide (SiO). As shown in FIGS. 1 and 4, a gate dielectric layer 1202 is grown on the outer peripheral surface of a channel layer 1201, which is not surrounded by a second isolation structure 1132. In addition, due to uncertainty in the oxidation growth process, the areas formed by the gate dielectric layer 1202 may be larger than the area shown in FIG. 1.

In addition, during the growth of the gate dielectric layer 1202, the gate dielectric layer 1202 can not only grow on partial surface of the channel layer 1201 but also can be formed on partial surface of the substrate 100. As shown in FIGS. 2 and 4, a gate dielectric layer 1202 is also grown on the upper surface of the substrate 100. The gate dielectric layer 1202 on the upper surface of the substrate 100 can insulate and isolate a gate conductive layer 1203 from the substrate 100.

A gate conductive layer 1203 may be formed on a partial surface of the gate dielectric layer 1202 by deposition, as shown in FIGS. 1 and 2. The gate conductive layer 1203 is formed in a region between the gate dielectric layer 1202 and the second isolation structure 1132, and completely fills the region between the gate dielectric layer 1202 and the second isolation structure 1132. The material of the gate conductive layer 1203 may include titanium nitride (TiN), tungsten (W), polysilicon or the like.

In the gate structure 1204, the channel layer 1201 may serve as the channel layer of a transistor, and the gate dielectric layers 1202 may serve as the gate dielectric layers of the transistors. Thus, as shown in FIG. 1, one capacitor structure 112 and one channel layer 1201 can form one 1T1C device. It can be seen that in such a 3D memory structure provided by the embodiments of the disclosure, the number of 1T1C devices is increased compared to a 2D memory structure.

In some embodiments, the gate structure 1204 is a gate-all-around structure.

It should be noted that, in the embodiments of the disclosure, the gate structure 1204 may adopt the gate-all-around (GAA) structure, and thus the semiconductor structure has a higher degree of integration.

In some embodiments, referring to FIGS. 2 to 5, the semiconductor structure may also include at least one isolation layer 130 for isolating each layer of the memory structure 110.

It should be noted that as shown in FIGS. 2 to 5, the semiconductor structure also includes at least one isolation layer 130. Above the substrate 100, the isolation layers 130 and the memory structures 110 are alternately arranged, so that the memory structures 110 are separated from each other by the isolation layers 130.

The word line structures 120 pass through at least one isolation layer 130 while passing through the memory structure 110.

The material of the isolation layer 130 may be a low k material. That is, the isolation layers 130, the isolation structure 113, and the third isolation structures 180 may be formed of the same material. Accordingly they are represented by the same filling pattern in the drawings, and in order to distinguish them, a border line is added at the joints of them. In practical application, if any two of them are made of the same material, no difference exists at the joints between them.

Two adjacent layers of the memory structures 110 are isolated by one isolation layer 130, so that mutual interference between the memory structures 110 of each layer is avoided, and a better isolation effect can be achieved for the memory structures 110 including the third isolation structures 180 under the combined isolation of the isolation layers 130 and the third isolation structures 180.

In some embodiments, referring to FIG. 1, the capacitor structure 112 may include an upper electrode 1121, a dielectric layer 1122, and a lower electrode 1123, and the dielectric layer 1122 is located between the upper electrode 1121 and the lower electrode 1123.

It should be noted that the material of the upper electrode 1121 and the lower electrode 1123 may include titanium, tantalum, tungsten, ruthenium and nitride, such as titanium nitride, tantalum nitride and the like. In the embodiments of the disclosure, the material of the upper electrode 1121 and the lower electrode 1123 may include titanium nitride. That is, the material of the upper electrode 1121 and the lower electrode 1123 may be the same as the material of the bit line structure 111, thus in the drawings of the embodiment of the disclosure, they may be represented by the same filling pattern. The lower electrode 1123 may be electrically connected to the source of the channel layer 1201. The material of the dielectric layer 1122 may include silicon dioxide ($SiO_2$), and may also include a high dielectric constant (high k) material, such as hafnium oxide, zirconium oxide, lanthanum oxide, alumina, hafnium silicon oxide, hafnium nitrogen oxide and the like.

In some embodiments, the width of the bit line structure 111 is smaller than the widths of the capacitor structures 112.

It should be noted that the width of the capacitor structure 112 is larger than the width of the bit line structure 111, so that a dielectric trench for accommodating the dielectric layer 1122 can be formed between two the upper electrode 1121 and the lower electrode 1123 in the process of forming the upper electrode 1121, the lower electrode 1123 and the bit line structure 111, when the material of the upper electrode 1121 and the lower electrode 1123 are the same as that of the bit line structure 111.

The embodiments of the disclosure provide a semiconductor structure, which includes: a substrate; at least one layer of memory structure formed on the substrate, in which each layer of the memory structure includes a bit line structure and multiple capacitor structures symmetrically distributed on both sides of the bit line structure, the capacitor structures and the bit line structure extend along a first direction parallel to the substrate surface; and multiple word line structures formed in the at least one layer of memory structure, which pass through the at least one layer of memory structure, and extend in a second direction perpendicular to the substrate surface. Thus, multiple layers of memory structures may be included in the semiconductor structure. In each layer of the memory structure, the capacitor structures are symmetrically distributed on both sides of the bit line structure, and the extending directions of the capacitor structures and the bit line structure are parallel to the substrate surface. In at least one layer of memory structure, multiple word line structures are formed, and the extending directions of the multiple word line structures are perpendicular to the substrate plane. Therefore, a 3D stack is formed with the word line structures, the bit line structure and the capacitor structures, to obtain the semiconductor structure having a 3D structure, and the number of 1T1C elements per unit area in the semiconductor structure is increased, thereby increasing the storage density of the semiconductor structure.

Figure 8:
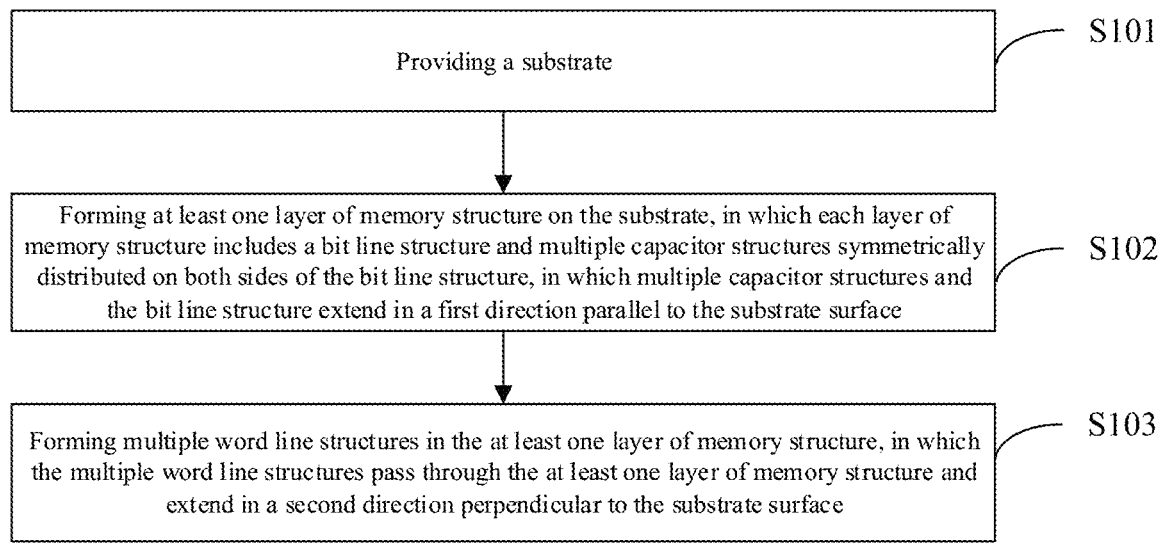
FIG. 8 is a flow scheme diagram of a preparation method of a semiconductor structure provided by the embodiments of the disclosure.

In another embodiment of the disclosure, referring to FIG. 8, a flow scheme diagram of a method for preparing the semiconductor structure provided by the embodiments of the disclosure is shown. As shown in FIG. 8, the method may include the following operations.

S101, a substrate is provided.

S102, at least one layer of memory structure is formed on the substrate, in which each layer of the memory structure includes a bit line structure and multiple capacitor structures symmetrically distributed on both sides of the bit line structure, in which the capacitor structures and the bit line structure extend in a first direction parallel to the substrate surface.

It should be noted that, when the semiconductor structure is prepared, a substrate is provided at first, and then at least one layer of memory structure is formed above the substrate. Each layer of the memory structure includes a bit line structure and multiple capacitor structures, and the capacitor structures are symmetrically distributed on both sides of the bit line structure. Moreover, the capacitor structures and the bit line structure are both extended in a first direction parallel to the substrate surface.

In some embodiments, the number of the at least one layer of memory structure can be set to N layers, and the value of N can be determined according to the actual storage demand and processing level. Forming at least one layer of memory structure on the substrate may include the following operation.

An isolation layer is formed on the substrate and a layer of memory structure is formed on the isolation layer;

The operations of forming an isolation layer and a layer of memory structure are repeated until N layers of memory structures are formed.

It should be noted that for forming the first layer of memory structure, firstly, the isolation layer is formed on the substrate, and then a layer of memory structure is formed on the isolation layer, thus obtaining one layer of memory structure. When it is necessary to form multiple layers of memory structures, a layer of isolation layer is continuously formed on the layer of memory structure that has been formed, and a layer of memory structure is formed on the isolation layer, thus obtaining another layer of memory structure. The operations of forming an isolation layer and forming a layer of memory structure on the isolation layer are repeatedly performed N times, thereby obtaining N layers of memory structures.

That is, after N layers of memory structures are obtained, at this time, N isolation layers and N layers of memory structures are alternately arranged above the substrate, that is, N isolation layers isolate N layers of memory structures from each other.

Since the memory structures can be a plurality of layers, and the capacitor structures are symmetrically distributed on both sides of one bit line structure in each layer of the memory structure, the number of bit line structures and capacitor structures in the semiconductor structure can be increased, and the memory capacity can be improved.

For the formation of the isolation layers and the memory structures, in some embodiments, forming the isolation layer on the substrate and forming the memory structure on the isolation layer may include the following operations.

An isolation layer and a substrate layer is formed above the substrate;

A first mask layer and a second mask layer is formed on the substrate layer;

A third patterning processing is performed on the substrate layer, the first mask layer and the second mask layer, to form at least one bit line trench and at least one pair of capacitor trenches, and the at least one bit line trench and the at least one pair of capacitor trenches expose the isolation layer, and each pair of capacitor trenches is symmetrically distributed on both sides of the bit line trench, and the width of the bit line trench is smaller than the width of the capacitor trench.

A bit line structure is formed in the bit line trench, and a capacitor structure is formed in the capacitor trenches, in which the top surface of the bit line structure and the top surface of the capacitor structure are in the same plane.

The substrate layer, the first mask layer and the second mask layer on the top surface of the bit line structure and the top surface of the capacitor structure are removed, to form the layer of memory structure.

Figure 9:
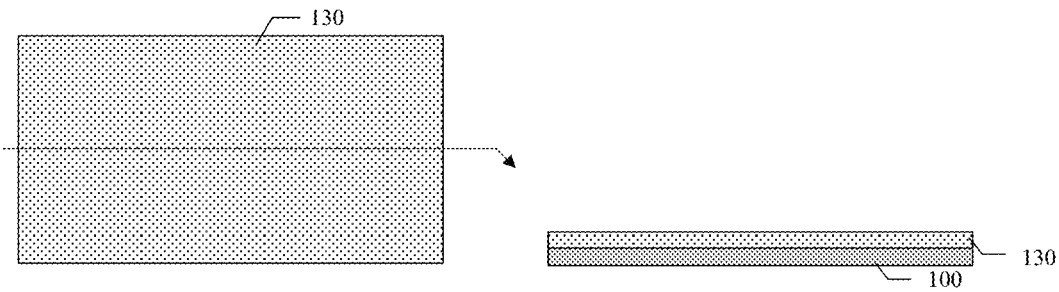
FIG. 9 is a scheme diagram of the structure obtained after forming an isolation layer provided by an embodiment of the disclosure.

It should be noted that, referring to FIG. 9, it shows a scheme diagram of the structure obtained after forming the isolation layer 130 provided by the embodiment of the disclosure, in which the left figure in FIG. 9 shows a top view scheme diagram, and the right figure in FIG. 9 shows a front view scheme diagram in the dotted line direction in the left figure. As shown in FIG. 9 the isolation layer 130 is formed on the substrate 100, in which the isolation layer 130 may be formed by depositing a low k material.

Figure 10:
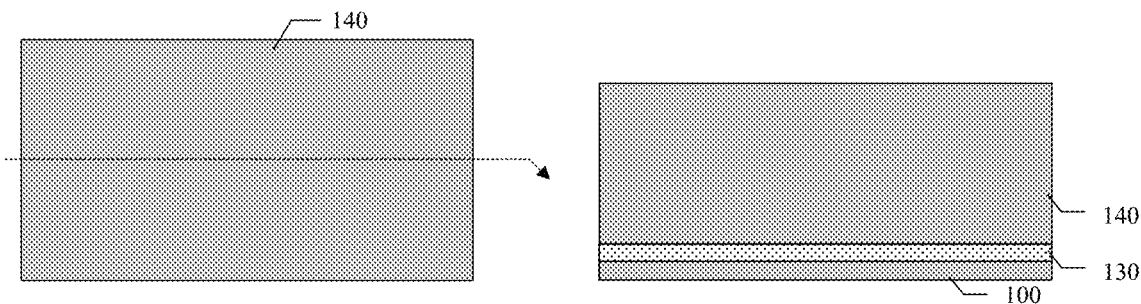
FIG. 10 is a scheme diagram of the structure obtained after forming a substrate layer provided by an embodiment of the disclosure.

Referring to FIG. 10, it shows a scheme diagram of the structure obtained after forming the substrate layer 140 provided by the embodiment of the disclosure, in which the left figure in FIG. 10 is a top view scheme diagram, and the right figure in FIG. 10 is a front view scheme diagram in the dotted line direction in the left figure. As shown in FIG. 10, the substrate layer 140 is formed on the isolation layer 130, in which the material of the substrate layer 140 may include P-type doped silicon or N-type doped silicon, or the like. Since the material of the substrate layer 140 and the substrate 100 may be the same, both of them are represented in the same filling pattern in the drawings, and the substrate layer 140 may be formed with epitaxial formation.

Figure 11:
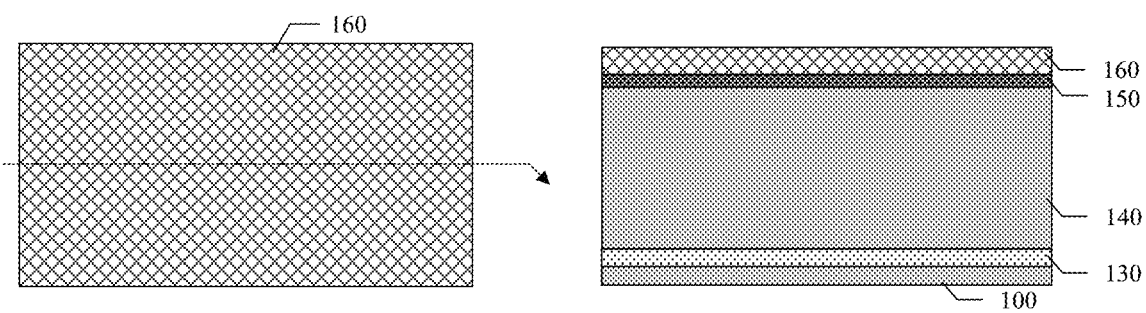
FIG. 11 is a scheme diagram of the structure obtained after forming a second mask layer provided by an embodiment of the disclosure.

After the substrate layer 140 is formed, the first mask layer 150 and the second mask layer 160 continue to be formed on the substrate layer 140. Referring to FIG. 11, it shows a scheme diagram of the structure obtained after forming the second mask layer 160 provided by the embodiment of the disclosure, in which the left figure in FIG. 11 is a top view scheme diagram, and the right figure in FIG. 11 is a front view scheme diagram in the dotted line direction in the left figure. As shown in FIG. 11, the first mask layer 150 and the second mask layer 160 are sequentially formed above the substrate layer 140, in which the material of the first mask layer 150 may include silicon oxide and the material of the second mask layer 160 may include silicon nitride.

The substrate layer 140, the first mask layer 150, and the second mask layer 160 are subjected to the third patterning processing, to obtain at least one bit line trench and at least one pair of capacitor trench.

Specifically, when the third patterning processing is performed on the substrate layer 140, the first mask layer 150, and the second mask layer 160, a third photoresist layer may firstly be formed above the second mask layer 160, in which the third photoresist layer has the third pattern. Then the third pattern of the third photoresist layer is transferred to the first mask layer 150 and the second mask layer 160, and finally the third pattern is transferred to the substrate layer 140 using the first mask layer 150 and the second mask layer 160 as a mask, and the third photoresist layer is removed.

Figure 12:
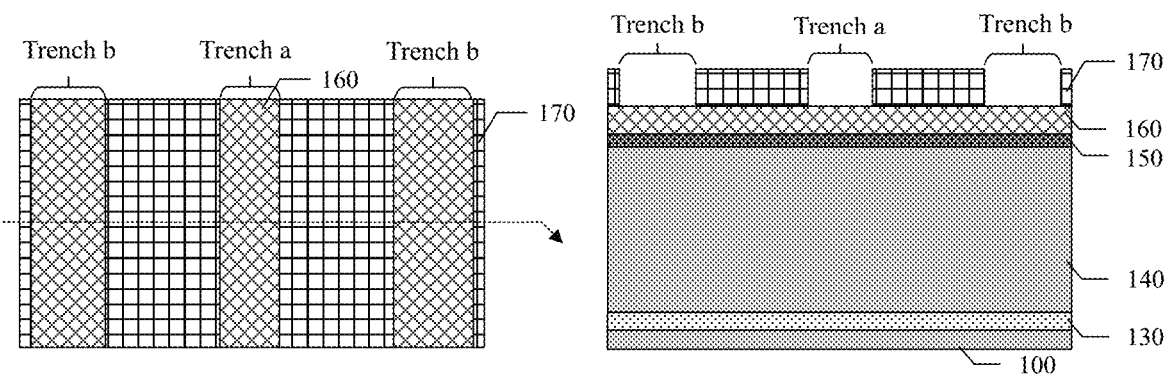
FIG. 12 is a scheme diagram of the structure obtained after forming a third photoresist layer provided by an embodiment of the disclosure.

For the third patterning processing, referring to FIG. 12, FIG. 12 shows a scheme diagram of the structure obtained after forming the third photoresist layer 170 provided by the embodiments of the disclosure, in which the left figure in FIG. 12 is a top view scheme diagram, and the right figure in FIG. 12 is a front view scheme diagram in the dotted line direction in the left figure.

As shown in FIG. 12, the third photoresist layer 170 has the third pattern, in which at least one a trench and at least one pair of b trenches are included in the third pattern, in which the width of a trench is smaller than that of b trench, and each pair of b trenches is symmetrically distributed on both sides of a trench. In FIG. 12, only one a trench and one pair of b trenches are shown. In actual production, multiple a trenches and multiple pairs of b trenches can be formed according to this arrangement based on actual requirements.

Figure 13:
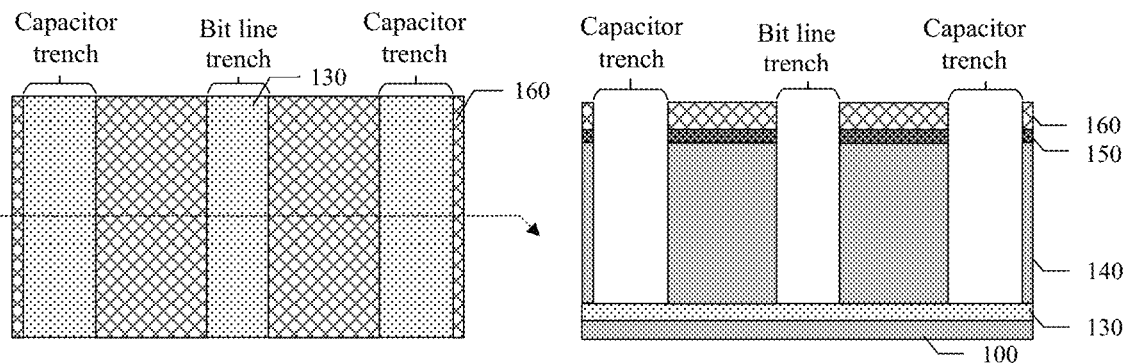
FIG. 13 is a scheme diagram of the structure obtained after forming a bit line trench and capacitor trenches provided by an embodiment of the disclosure.

Referring to FIGS. 12 and 13 the third pattern is transferred to the substrate layer 140 and the third photoresist layer 170 is removed to obtain at least one bit line trench and at least one pair of capacitor trenches. FIG. 13 is a scheme diagram of the structure obtained after forming the bit line trench and the capacitor trenches provided by the embodiment of the disclosure on the basis of FIG. 12, in which the left figure in FIG. 13 is a top view scheme diagram, and the right figure in FIG. 13 is a front view scheme diagram in the dotted line direction in the left figure.

As shown in FIGS. 12 and 13, after the third pattern is transferred to the second mask layer 160, the first mask layer 150 and the substrate layer 140, at least one bit line trench and at least one pair of capacitor trenches can be formed. Here, when transferring the third pattern, a dry etching method can be adopted.

In the embodiment, a bit line trench is formed based on a trench, a capacitor trench is formed based on b trench, and the bit line trench and the capacitor trench expose the isolation layer 130, and the width of the bit line trench is smaller than the width of the capacitor trench. In addition, in FIG. 13, only one bit line trench and one pair of capacitor trenches are shown. In actual production, multiple bit line trenches and multiple pairs of capacitor trenches can be formed according to this arrangement based on actual requirements.

After the third photoresist layer is removed, a bit line structure is formed in the bit line trench and a capacitor structure is formed in the capacitor trench so that the top surface of the bit line structure and the top surface of the capacitor structure are in the same plane.

As for the formation of the bit line structure and the capacitor structure, in one implementation, forming the bit line structure within the bit line trench and forming the capacitor structure within the capacitor trench may include the following operations.

Third isolation structures are formed on the second mask layer and the isolation layer;

A conductive layer is formed in at least one bit line trench, at least one pair of capacitor trench and the surface of the third isolation structures, and the conductive layer formed in each capacitor trench includes two parts: an upper electrode and a lower electrode, and a dielectric trench exists between the upper electrode and the lower electrode.

A dielectric layer is formed in each dielectric trench, and the dielectric layers and the top surface of the conductive layer are in the same plane, in which the bit line structure is composed of the conductive layer in the bit line trench, and each capacitor structure is composed of the upper electrode, the lower electrode and the dielectric layer in the capacitor trench.

It should be noted that, when the third isolation structures is formed on the second mask layer and the isolation layer, an initial third isolation structure may firstly be formed at the bottom and sidewalls of the bit line trench and the capacitor trenches, and above the second mask layer, and then the initial third isolation structure of the sidewall portion within the bit line trench and within the capacitor trenches is removed, and the remaining initial third isolation structure constitutes the third isolation structures.

Figure 14:
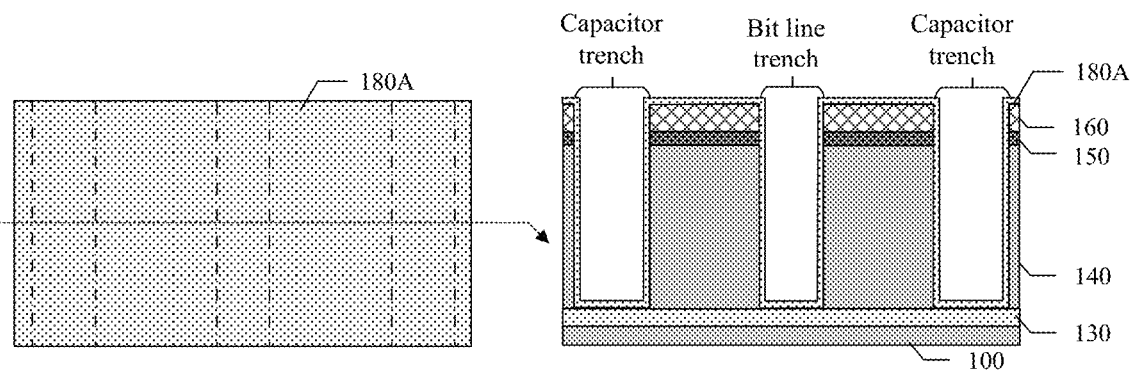
FIG. 14 is a scheme diagram of the structure obtained after forming an initial third isolation structure provided by an embodiment of the disclosure.

Referring to FIG. 14, it shows a scheme diagram of the structure obtained after forming the initial third isolation structure 180A provided by the embodiment of the disclosure, in which the left figure in FIG. 14 is a top view scheme diagram, and the right figure in FIG. 14 is a front view scheme diagram in the dotted line direction in the left figure. As shown in FIG. 14, the initial third isolation structure 180A is formed at the bottom and sidewalls of the bit line trench and the capacitor trenches and above the second mask layer 160.

In the embodiment, the material of the initial third isolation structure 180A may be a low k material, that is, the material of the initial third isolation structure 180A may be the same as the material of the isolation layer 130. Thus, the isolation layer 130 and the initial third isolation structure 180A are represented in the same filling pattern in FIG. 14. The initial third isolation structure 180A may be formed by Atomic Layer Deposition (ALD).

An intermediate oxide structure may also be formed on the surface of the initial third isolation structure 180A before removing the initial third isolation structure 180A on the sidewalls of the bit line trench and the capacitor trenches. The initial third isolation structure 180A is partially removed based on the intermediate oxide structure to form the third isolation structures.

Figure 15:
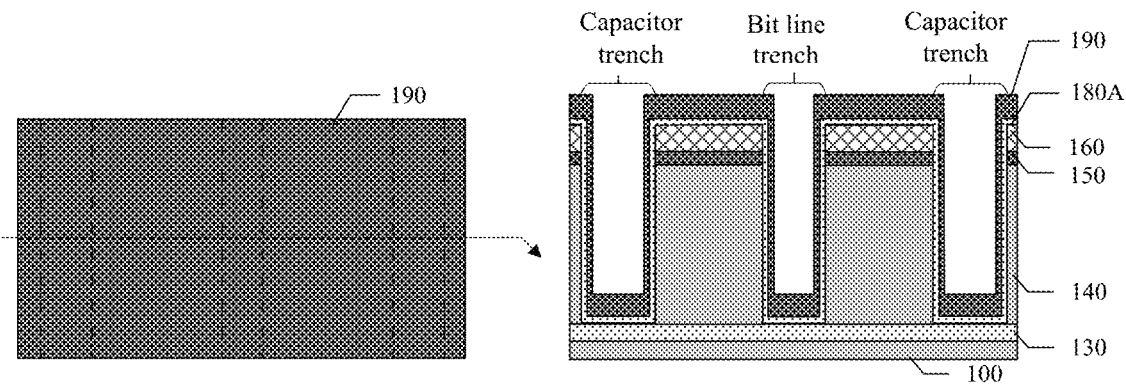
FIG. 15 is a scheme diagram of the structure obtained after forming an intermediate oxide structure provided by an embodiment of the disclosure.

Referring to FIG. 15, it shows a scheme diagram of the structure obtained after forming the intermediate oxide structure 190 provided by the embodiment of the disclosure, in which the left figure in FIG. 15 is a top view scheme diagram, and the right figure in FIG. 15 is a front view scheme diagram in the dotted line direction in the left figure. As shown in FIG. 15, the intermediate oxide structure 190 is formed on the surface of the initial third isolation structure 180A, in which the material of the intermediate oxide structure 190 may include silicon oxide or the like, and the formation method thereof may be ALD. Since the material of the intermediate oxide structure 190 and the material of the first mask layer 150 may be the same, both are represented in the same filling pattern in the drawings. The thickness of the intermediate oxide structure 190 formed in the bit line trench and the capacitor trenches is the same as the thickness of the intermediate oxide structure 190 formed on the top.

Figure 16:
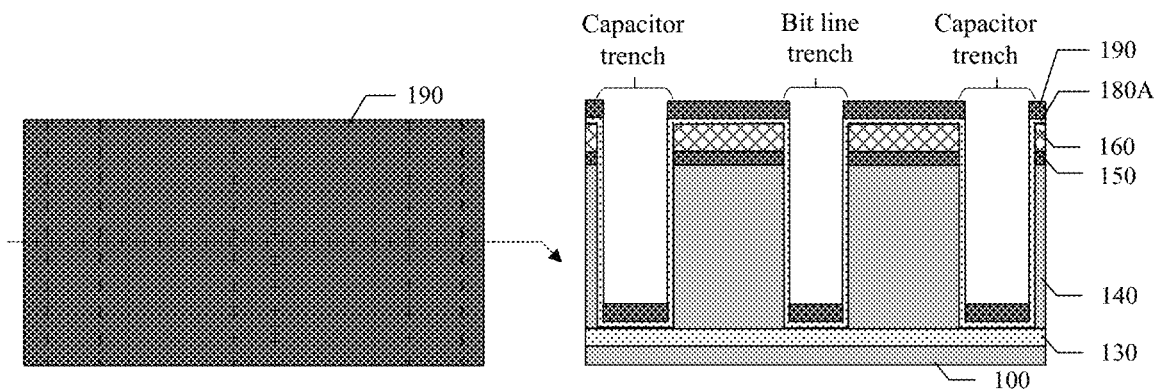
FIG. 16 is a scheme diagram of the structure obtained after removing part of the intermediate oxide structure provided by an embodiment of the disclosure.

Further, referring to FIGS. 15 to 16, FIG. 16 shows a scheme diagram of the structure obtained by removing part of the intermediate oxide structure 190 provided by the embodiment of the disclosure on the basis of FIG. 15, in which the left figure in FIG. 16 is a top view scheme diagram, and the right figure in FIG. 16 is a front view scheme diagram in the dotted line direction in the left figure. As shown in FIGS. 15 and 16, part of the intermediate oxide structure 190 located on the initial third isolation structure 180A of the sidewalls of the bit line trench and the capacitor trenches is removed. The part of the intermediate oxide structure 190 can be removed by means of vapor etch at this time. As for the intermediate oxide structure 190 formed in the bit line trench and the capacitor trenches and on the top, the same thickness of the intermediate oxide structure 190 is removed.

Figure 17:
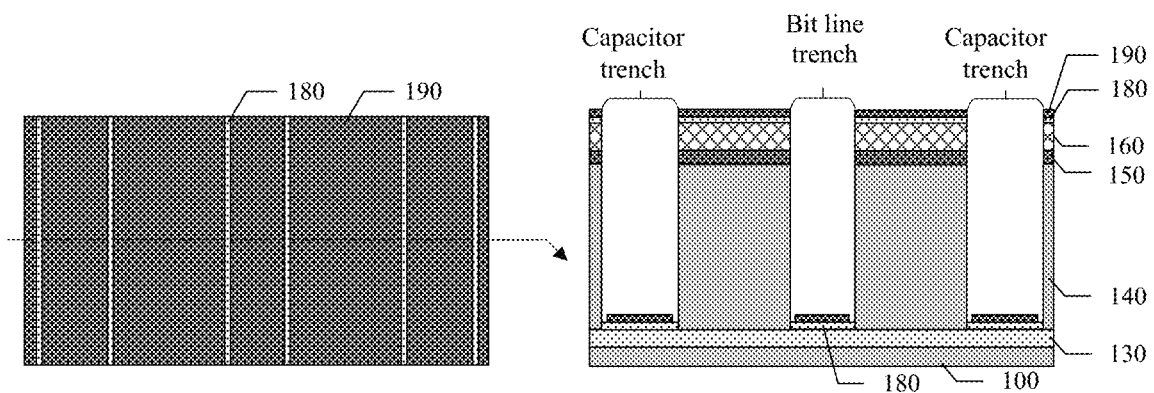
FIG. 17 is a scheme diagram of the structure obtained after forming third isolation structures provided by an embodiment of the disclosure.

Referring to FIGS. 16 to 17, the initial third isolation structure 180A located on the sidewalls of the bit line trench and the capacitor trenches is removed to obtain the third isolation structures 180. FIG. 17 is a scheme diagram of the structure obtained after forming the third isolation structures 180 provided by the embodiments of the disclosure on the basis of FIG. 16, in which the left figure in FIG. 17 is a top view scheme diagram, and the right figure in FIG. 17 is a front view scheme diagram in the dotted line direction in the left figure. As shown in FIGS. 16 and 17, the initial third isolation structure 180A located on the sidewalls of the bit line trench and the capacitor trenches is removed, and only the initial third isolation structure 180A located above the isolation layer 130 and above the second mask layer 160 is retained, and the partially retained third isolation structure 180A is the third isolation structure 180. Meanwhile, the intermediate oxide structures 190 are also partially removed and the thickness is reduced, and as for the intermediate oxide structures 190 formed in the bit line trench and the capacitor trenches as well as on the top, the same thickness of the intermediate oxide structures 190 is removed.

The third isolation structures 180 can reduce the parasitic capacitance between the wires in the semiconductor structure and mitigate the crosstalk between the signals so as to play a good isolation role.

Figure 18:
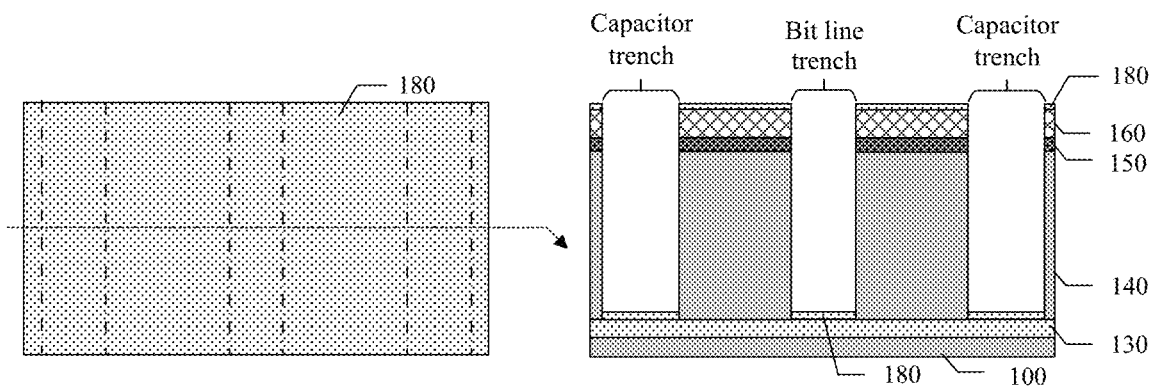
FIG. 18 is a scheme diagram of the structure obtained after removing all intermediate oxide structures provided by an embodiment of this disclosure.

Referring to FIGS. 17 to 18, the remaining intermediate oxide structure 190 are completely removed. FIG. 18 is a scheme diagram of the structure obtained by removing all the intermediate oxide structure 190 provided by the embodiment of the disclosure on the basis of FIG. 17, in which the left figure in FIG. 18 is a top view scheme diagram, and the right figure in FIG. 18 is a front view scheme diagram in the dotted line direction in the left figure.

Figure 19:
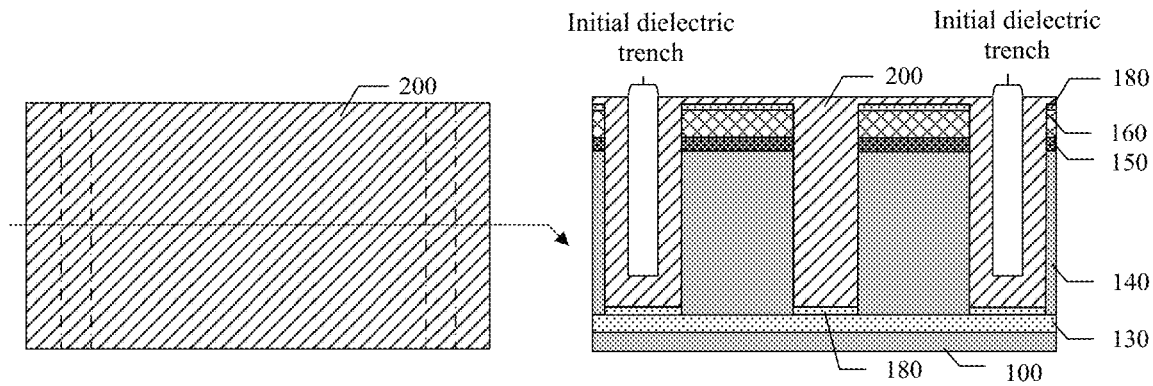
FIG. 19 is a scheme diagram I of the structure obtained after forming a conductive layer provided by an embodiment of the disclosure.

As shown in FIG. 19, a conductive layer 200 is formed on the surface of the bit line trench, the capacitor trenches and the third isolation structures 180. Referring to FIG. 19, it shows a scheme diagram of the structure obtained after forming the conductive layer 200 provided by the embodiment of the disclosure, in which the left figure in FIG. 19 is a top view scheme diagram, and the right figure in FIG. 19 is a front view scheme diagram in the dotted line direction in the left figure.

As shown in FIG. 19, since the width of the capacitor trenches may be greater than the width of the bit line trench in the embodiment of the disclosure, the conductive layer 200 may completely fill the bit line trench and partially fill the capacitor trenches when the conductive layer 200 is formed, so that initial dielectric trenches exist between the conductive layer 200 formed in the capacitor trenches. The material of the conductive layer 200 may include titanium nitride, and the formation method of the conductive layer 200 may be deposition. In subsequent operations, the conductive layer 200 formed in each capacitor trench may form the upper electrode and the lower electrode of the capacitor structure, respectively, and the conductive layer 200 formed in the bit line trench may form the bit line structure.

Figure 20:
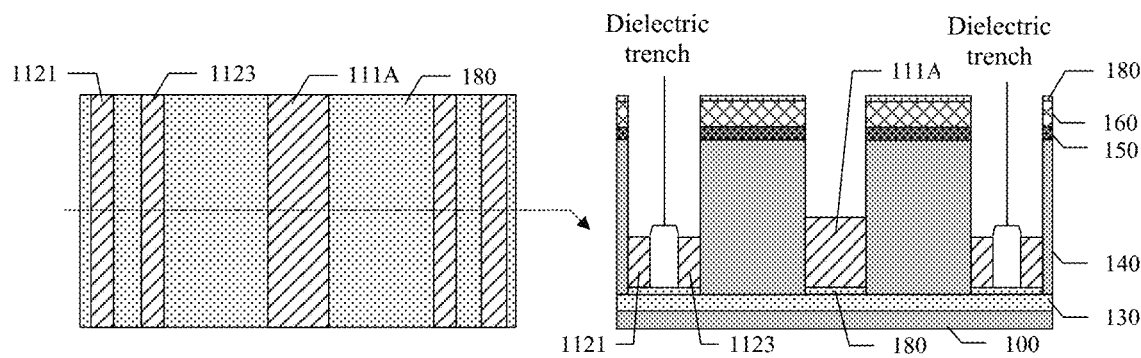
FIG. 20 is a scheme diagram of the structure obtained after removing part of the conductive layer provided by an embodiment of this disclosure.

Referring to FIGS. 19 to 20, a part of the conductive layer 200 is removed and the part of the conductive layer 200 in the bit line trench and the capacitor trench is retained. FIG. 20 is a scheme diagram of the structure obtained by removing part of the conductive layer 200 provided by the embodiment of the disclosure on the basis of FIG. 19, in which the left figure in FIG. 20 shows a top view scheme diagram, and the right figure in FIG. 20 shows a front view scheme diagram in the dotted line direction in the left figure. As shown in FIGS. 19 and 20, the conductive layer 200 located on the top above the third isolation structures 180 and the conductive layer 200 located on both sides and bottom of each initial medium trench are removed, in which part of the conductive layer 200 can be removed by etch back.

At this time, for the remaining conductive layer 200, it may include an upper electrode 1121 and a lower electrode 1123 located in each capacitor trench, and an initial bit line structure 111A located within the bit line trench, and a dielectric trench also presents between the upper electrode 1121 and the lower electrode 1123.

Since the conductive layer 200 in the bit line trench is fully filled, the conductive layer 200 in the capacitor trenches is partially filled, when the back etching is performed, more of the conductive layer 200 in the capacitor trenches and less of the conductive layer 200 in the bit line trench is removed less in the vertical direction, so that the height of the initial bit line structure 111A is slightly higher than the height of the upper electrode 1121 and the lower electrode 1123.

Figure 21:
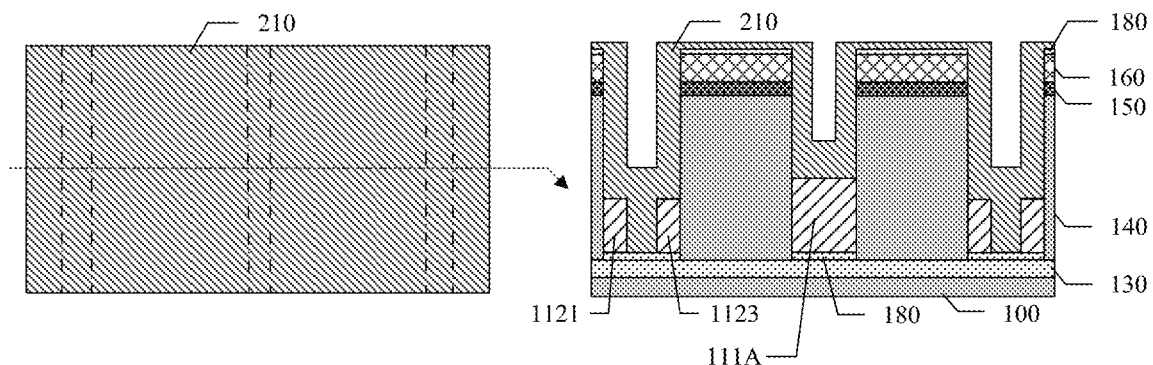
FIG. 21 is a scheme diagram of the structure obtained after forming an initial dielectric layer provided by an embodiment of the disclosure.

A dielectric layer is formed in the dielectric trenches so that top surface of the dielectric layer and the conductive layer are in the same plane. During forming the dielectric layer, an initial dielectric layer is firstly formed on the conductive layer and the third isolation structure 180. Referring to FIG. 21, it shows a scheme diagram of the structure obtained after forming the initial dielectric layer 210 provided by the embodiment of the disclosure, in which the left figure in FIG. 21 is a top view scheme diagram, and the right figure in FIG. 21 is a front view scheme diagram in the dotted line direction in the left figure. As shown in FIG. 21, the initial dielectric layer 210 completely fills the dielectric trenches and covers the upper electrodes 1121, the lower electrodes 1123, the initial bit line structure 111A and the third isolation structures 180, in which the material of the initial dielectric layer 210 may include a high k material, which may be formed by deposition. As shown in FIG. 21, the initial dielectric layer 210 may partially fill the capacitor trenches and the bit line trench.

Figure 22:
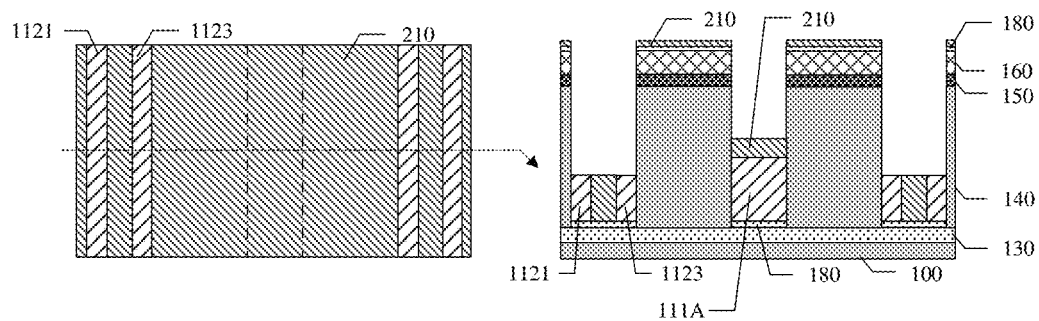
FIG. 22 is a scheme diagram of the structure obtained after removing part of the initial dielectric layer provided by the embodiments of the disclosure.

Referring to FIGS. 21 to 22, part of the initial dielectric layer 210 within the capacitor trenches and the bit line trench is removed. FIG. 22 is a scheme diagram of the structure obtained by removing part of the initial dielectric layer 210 provided by the embodiment of the disclosure on the basis of FIG. 21, in which the left figure in FIG. 22 is a top view scheme diagram, and the right figure in FIG. 22 is a front view scheme diagram in the dotted line direction in the left figure. As shown in FIGS. 21 and 22, in the capacitor trenches, the initial dielectric layer 210 located above the upper electrodes 1121 and the lower electrodes 1123 is completely removed, and in the bit line trench, the initial dielectric layer 210 is partially removed, and the method for removing the initial dielectric layer 210 may be back etching.

Figure 23:
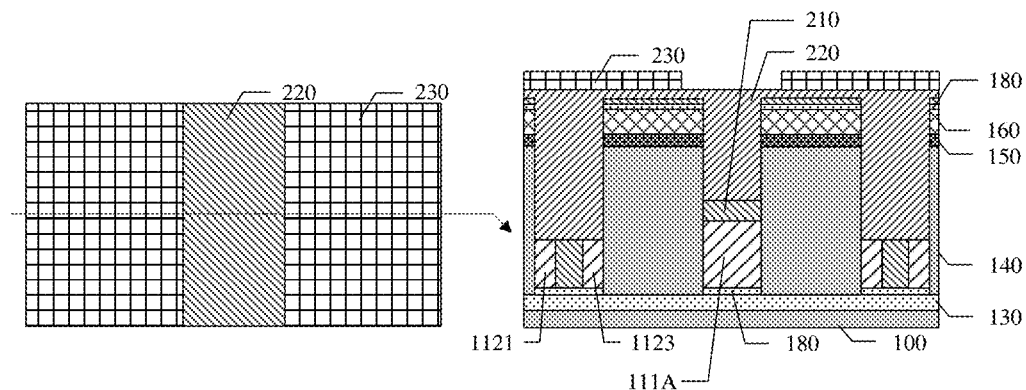
FIG. 23 is a scheme diagram of the structure obtained after forming a fourth photoresist layer provided by an embodiment of the disclosure.

As shown in FIG. 23, a hard mask structure 220 (Spin On Hardmask, SOH) is formed on the initial dielectric layer 210, and a fourth photoresist layer 230 is formed on the SOH 220. Referring to FIG. 23, it shows a scheme diagram of the structure obtained after forming the fourth photoresist layer 230 provided by the embodiment of the disclosure, in which the left view in FIG. 23 is a top view scheme diagram, and the right view in FIG. 23 is a front view scheme diagram in the dotted line direction in the left view. As shown in FIG. 23, the SOH 220 is formed on the initial dielectric layer 210, the upper electrodes 1121 and the lower electrodes 1123 to completely fill the bit line trench and the capacitor trenches, and covers the initial dielectric layers 210 on the top of the structure. The fourth photoresist layer 230 with a fourth pattern is formed on the SOH 220.

Figure 24:
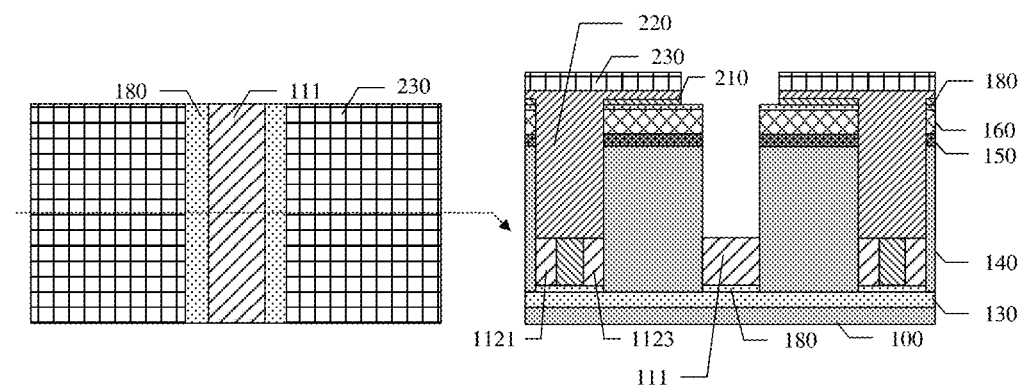
FIG. 24 is a scheme diagram of the structure obtained after transferring the fourth pattern provided by an embodiment of the disclosure.

By using the fourth photoresist layer 230 as a mask to transfer the fourth pattern, the initial dielectric layer 210 and part of the initial bit line structure 111A located in the bit line trench are removed. Referring to FIG. 24, it shows a scheme diagram of the structure obtained after transferring the fourth pattern provided by the embodiment of the disclosure, in which the left figure in FIG. 24 is a top view scheme diagram, and the right figure in FIG. 24 is a front view scheme diagram in the dotted line direction in the left figure. As shown in FIG. 24, the fourth pattern is transferred to the SOH 220 and part of the initial dielectric layer 210 above the surface of the top third isolation structure 180, and the SOH 220 and the initial dielectric layer 210 located in the bit line trench are removed by back etching.

In some embodiments, before removing the substrate layer, the first mask layer and the second mask layer located on the top surface of the bit line structure and the top surface of the capacitor structures to form a layer of memory structure, the method may further include the following operations.

Part of the conductive layer in the bit line trench is removed so that the conductive layer of the bit line structure and the conductive layers of the capacitor structures are in the same plane.

It should be noted that, as shown in FIG. 24, before forming the layer of memory structure, part of the conductive layer 200 in the bit line trench needs to be removed, that is, the initial bit line structure 111A needs to be partially removed so that the height of the initial bit line structure 111A is reduced to a height such that the top of the initial bit line structure 111A is in the same plane as the tops of the upper electrodes 1121 and the lower electrodes 1123, thereby obtaining the bit line structure 111.

Figure 25:
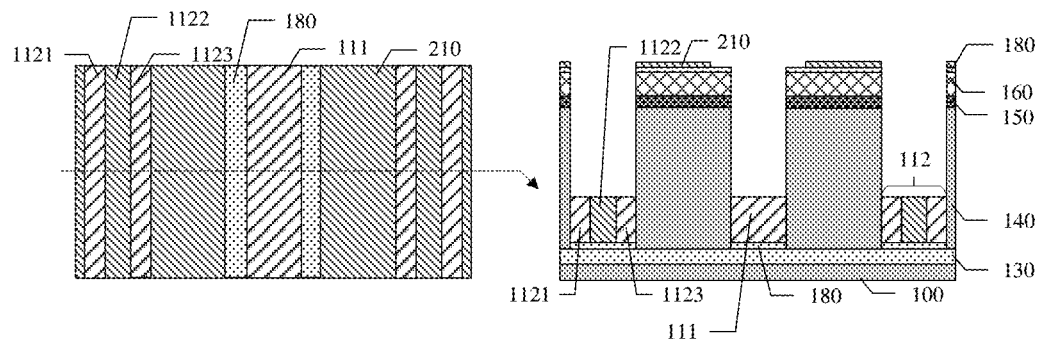
FIG. 25 is a scheme diagram of the structure obtained after SOH removal provided by an embodiment of the disclosure.

Referring to FIGS. 24 to 25, the fourth photoresist layer 230 and the remaining SOH 220 are removed, to obtain the capacitor structures 112 and the bit line structure 111 with flush top surfaces. FIG. 25 is a scheme diagram of the structure obtained by removing SOH 220 provided by the embodiments of the disclosure on the basis of FIG. 24, in which the left figure in FIG. 25 is a top view scheme diagram, and the right figure in FIG. 25 is a front view scheme diagram in the dotted line direction in the left figure. As shown in FIGS. 24 and 25, the initial dielectric layer 210 retained in each capacitor trench forms the dielectric layer 1122. The dielectric layer 1122, the upper electrode 1121 and the lower electrode 1123 constitute the capacitor structure 112, and the top surfaces of the capacitor structure 112 and the bit line structure 111 are flush.

Therefore, the top surfaces of the capacitor structures 112 and the bit line structure 111 are located in the same plane, so as to readily form more layers of memory structures above the top surfaces, which is beneficial to improving the integration level of the semiconductor structure.

Figure 26:
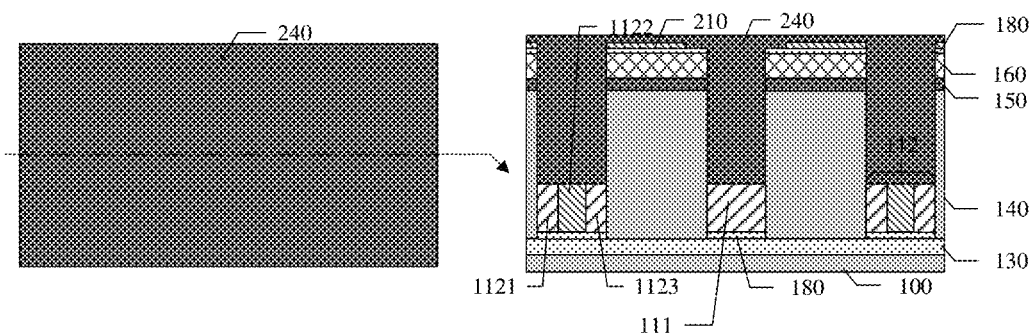
FIG. 26 is a scheme diagram of the structure obtained by forming an oxide structure provided by an embodiment of the disclosure.

As shown in FIG. 26, an oxidation structure 240 is formed within the capacitor trenches and the bit line trench and on the top of the third isolation structures 180 and the surface of the initial dielectric layer 210. Referring to FIG. 26, it shows a scheme diagram of the structure obtained by forming an oxidation structure 240 provided by the embodiment of the disclosure, in which the left view in FIG. 26 is a top view scheme diagram, and the right view in FIG. 26 is a front view scheme diagram in the dotted line direction in the left view. As shown in FIG. 26, the oxidation structure 240 completely fills the remaining bit line trench and capacitor trenches, and covers the initial dielectric layer 210 and the third isolation structures 180 on the top of the structure.

In the embodiment, the material of the oxidation structure 240 may include silicon oxide, which may be formed by a low temperature oxide filling method. Since the materials of the oxidation structure 240 and the first mask layer 150 may be the same, they may be shown in the same filling pattern in FIG. 26.

Figure 27:
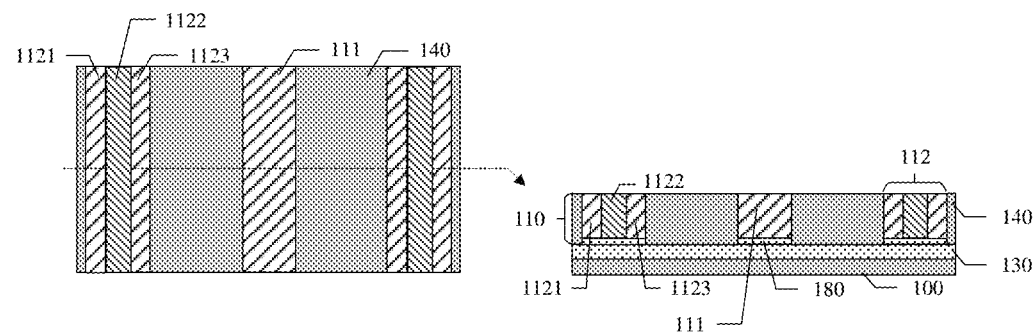
FIG. 27 is a scheme diagram of the structure obtained after forming a one-layer of memory structure provided by an embodiment of the disclosure.

Referring to FIGS. 26 and 27, the substrate layer 140, the first mask layer 150, the second mask layer 160, the third isolation structures 180, and the oxide structure 240 above the top plane of the bit line structure 111 and the capacitor structures 112 are all removed, to obtain a layer of memory structure 110. FIG. 27 is a scheme diagram of the structure obtained by forming a layer of memory structure 110 on the basis of FIG. 26, in which the left view in FIG. 27 is a top view scheme diagram, and the right view in FIG. 27 is a front view scheme diagram in the dotted line direction in the left view. The method for removing the substrate layer 140 may be back etching.

As shown in FIG. 27, one layer of the memory structure 110 includes at least one bit line structure 111 and at least one pair of capacitor structures 112. FIG. 27 shows one bit line structure 111 and one pair of capacitor structures 112. In practical production, multiple bit line structures 111 and multiple pairs of capacitor structures 112 can be formed according to this arrangement based on actual requirements.

In the implementation, as shown in FIG. 27, the bottom of the memory structure 110 further includes the third isolation structures 180, by which good insulation between the components can be achieved.

As for the formation of the bit line structure 111 and the capacitor structures 112, in another implementation, forming the bit line structure within the bit line trench and forming the capacitor structures within the capacitor trenches, which may include the following operations.

A conductive layer is filled in at least one bit line trench and at least one pair of capacitor trenches, in which the conductive layer fills up the bit line trench, and the conductive layer formed in each capacitor trench includes an upper electrode and a lower electrode, and a dielectric trench exists between the upper electrode and the lower electrode.

A dielectric layer is formed in the dielectric trench, and the dielectric layer and the top surface of the conductive layer are in the same plane, in which the bit line structure is composed of the conductive layer in the bit line trench, and each capacitor structure is composed of an upper electrode, a lower electrode and a dielectric layer in each capacitor trench.

Figure 28:
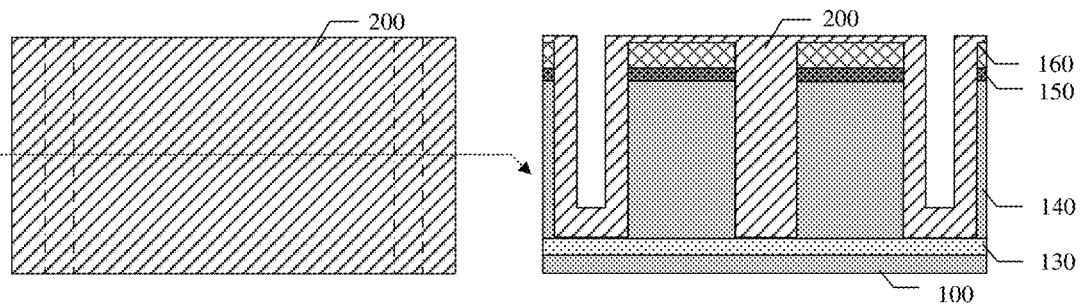
FIG. 28 is a scheme diagram II of the structure obtained after forming a conductive layer provided by an embodiment of the disclosure.

It should be noted that, the difference between this implementation from the previous one is that the conductive layer can be directly formed in the bit line trench and capacitor trenches without forming a third isolation structure in the embodiment of the disclosure. Referring to FIG. 28, it shows a scheme diagram II of the structure obtained after forming the conductive layer 200 provided by the embodiment of the disclosure, in which the left figure in FIG. 28 is a top view scheme diagram, and the right figure in FIG. 28 is a front view scheme diagram in the dotted line direction in the left figure. The subsequent forming operations can be understood with reference to the foregoing FIGS. 19 to 27, and related descriptions will not be repeated here. In this implementation, the resulting memory structure 110 does not include third isolation structures.

In this implementation, since the third isolation structure does not need to be formed, the process is simpler.

Further, when it is necessary to form multiple layers of memory structures, the operations of forming the isolation layer and the memory structures are repeated to continue the formation above the formed memory structure until N layers of the memory structures are obtained.

Figure 29:
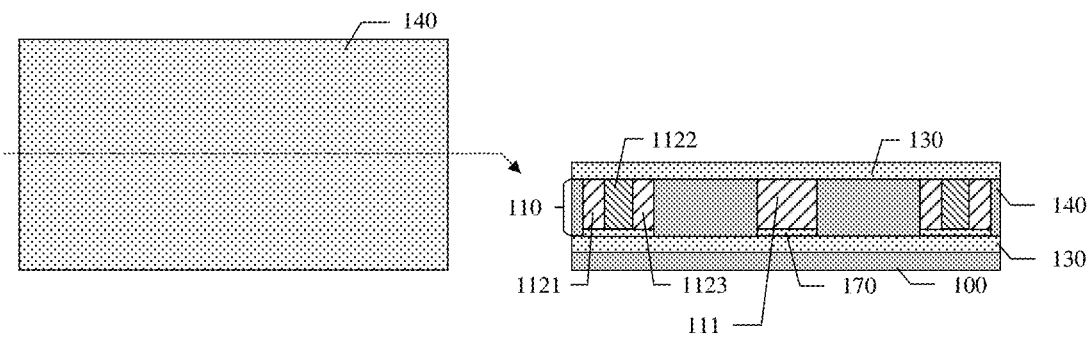
FIG. 29 is a scheme diagram of the structure obtained after forming a second isolation layer provided by an embodiment of the disclosure.

Referring to FIG. 29, it shows a scheme diagram of the structure obtained after forming a second isolation layer 130 provided by the embodiment of the disclosure, in which the left view in FIG. 29 is a top view scheme diagram, and the right view in FIG. 29 is a front view scheme diagram in the dotted line direction in the left view. As shown in FIG. 29, an isolation layer 130 is further formed on the first layer of memory structure 110.

Figure 30:
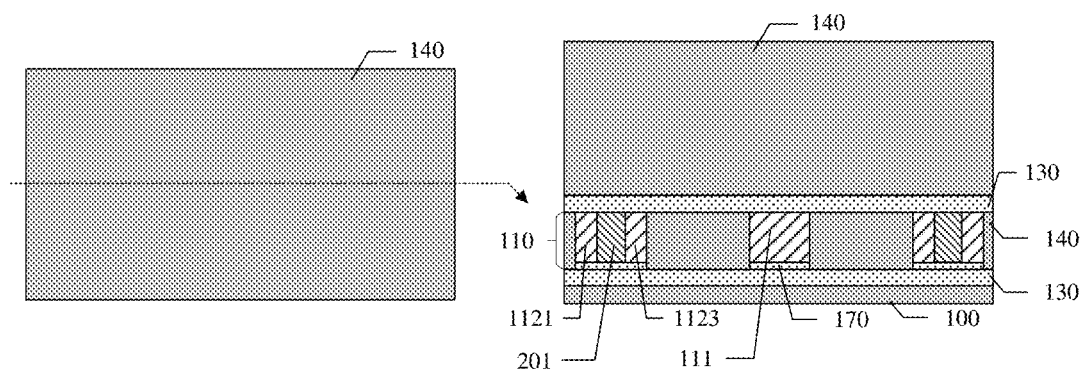
FIG. 30 is a scheme diagram of the structure obtained after forming a second substrate layer provided by an embodiment of the disclosure.

Referring to FIG. 30, it shows a scheme diagram of the structure obtained after forming a second substrate layer 140 provided by the embodiment of the disclosure, in which the left view in FIG. 30 is a top view scheme diagram, and the right view in FIG. 30 is a front view scheme diagram in the dotted line direction in the left view. As shown in FIG. 30, a second substrate layer 140 is formed on the second isolation layer 130.

Figure 31:
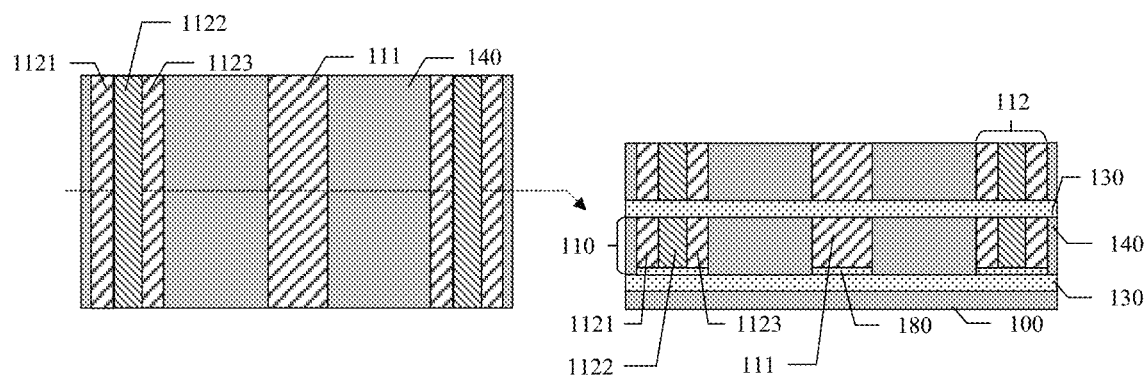
FIG. 31 is a scheme diagram of the structure obtained after forming a second layer of memory structure provided by an embodiment of the disclosure.

As shown in FIG. 31, a second layer of memory structure 110 is formed in the second substrate layer 140. Referring to FIG. 31, it shows a scheme diagram of the structure obtained after forming a second layer of memory structure 110 provided by the embodiment of the disclosure, in which the left figure in FIG. 31 is a top view scheme diagram, and the right figure in FIG. 31 is a front view scheme diagram in the dotted line direction in the left figure. As shown in FIG. 31, the first layer of memory structure 110 includes the third isolation structures 180, and the second layer of memory structure 110 does not include any third isolation structure 180.

Figure 32:
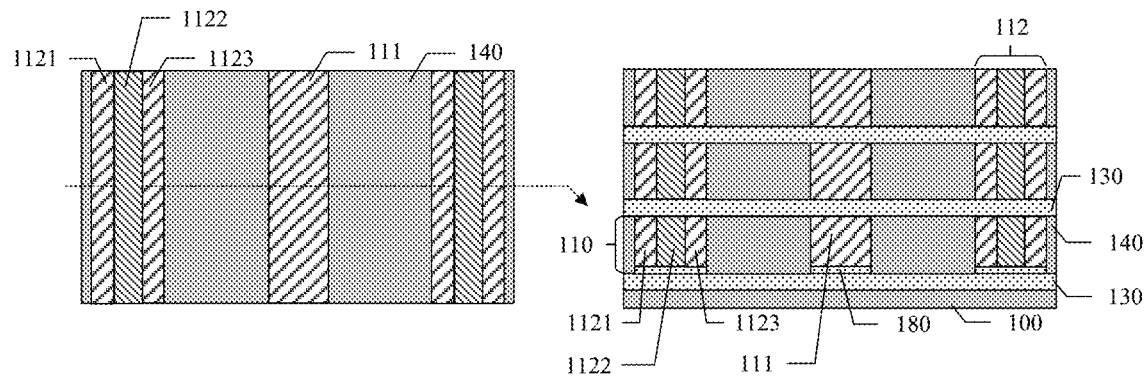
FIG. 32 is a scheme diagram of the structure obtained after forming a third layer of memory structure provided by an embodiment of the disclosure.

Referring to FIG. 32, it shows a scheme diagram of the structure obtained after forming a third layer of memory structure 110 provided by the embodiments of the disclosure is shown, in which the left figure in FIG. 32 is a top view scheme diagram, and the right figure in FIG. 32 is a front view scheme diagram in the dotted line direction in the left figure. As shown in FIG. 32, the first layer of memory structure 110 includes the third isolation structures 180, and the third isolation structures 180 are not included in the second layer of memory structure 110 and the third layer of memory structure 110.

Thus the multiple memory structures 110 are isolated by multiple isolation layers 130, thereby forming the semiconductor structure in which multiple memory structures 110 are stacked, which increases the memory density of the semiconductor structure.

S103, multiple word line structures are formed in the at least one layer of memory structure. The word line structures pass through the at least one layer of memory structure, and extend along a second direction which is perpendicular to the substrate surface.

Exemplary description is made by taking three layers of memory structures as an example the at least one layer of memory structure. Multiple word line structures passing through the at least one layer of memory structure are formed. The multiple word line structures extend in a second direction, and the second direction represents a direction perpendicular to a substrate plane.

In some embodiments, forming the multiple word line structures in at least one layer of memory structure may include the following operations.

A first isolation structure and a second isolation structure are formed in the at least one layer of memory structure, in which the first isolation structure is configured to isolate the capacitor structures and the second isolation structure is configured to isolate the word line structures.

It should be noted that, when the multiple word line structures are formed, the first isolation structure and the second isolation structure can be formed in the at least one layer of memory structure, in which the first isolation structure is configured to isolate the capacitor structures and the second isolation structure is configured to isolate the word line structures. Thus, the number of bit line structures and the number of capacitor structures can be effectively increased by the isolation of the first isolation structures and the second isolation structures.

In some embodiments, forming the first isolation structure and the second isolation structure in the at least one layer of memory structure may include the following operations.

A first patterning treatment is performed on the at least one layer of memory structure, to form at least one pair of first trenches, in which each pair of first trenches are symmetrically distributed along the bit line structure, and a first trench includes a first part and a second part, an active layer is formed between two adjacent ones of the second parts, and the active layer includes a source region, a drain region and a channel layer.

A first isolation structure is formed in the first portion and an initial second isolation structure is formed in the second portion.

It should be noted that when the first isolation structure and the second isolation structure are formed in the at least one layer of memory structure, the first patterning process can be performed on the at least one layer of memory structure to form at least one pair of first trenches, and the first isolation structure and the second isolation structure are formed in the first trench.

Further, in some embodiments, performing the first patterning process on the at least one layer of memory structure to form at least one pair of the first trench may include the following operations.

A first photoresist layer on the at least one layer of memory structure is formed, in which the first photoresist layer includes at least one pair of first patterns, each pair of first patterns are symmetrically distributed along the bit line structure, and the first pattern includes a first shape and a second shape.

The at least one layer of memory structure is patterned with at least one pair of first patterns as a mask, to form the first portion and the second portion of the first trench, in which the first portion isolates the same layer of capacitor structure into multiple capacitor structures, and the second portion exposes the substrate, the sidewalls of the multiple capacitor structures and the sidewalls of the multiple bit line structures.

The first photoresist layer is removed.

It should be noted that during forming the first trench, the first photoresist layer is formed on the at least one layer of memory structure, and then the at least one layer of memory structure is patterned with the first photoresist layer as a mask to obtain the first trench.

Figure 33:
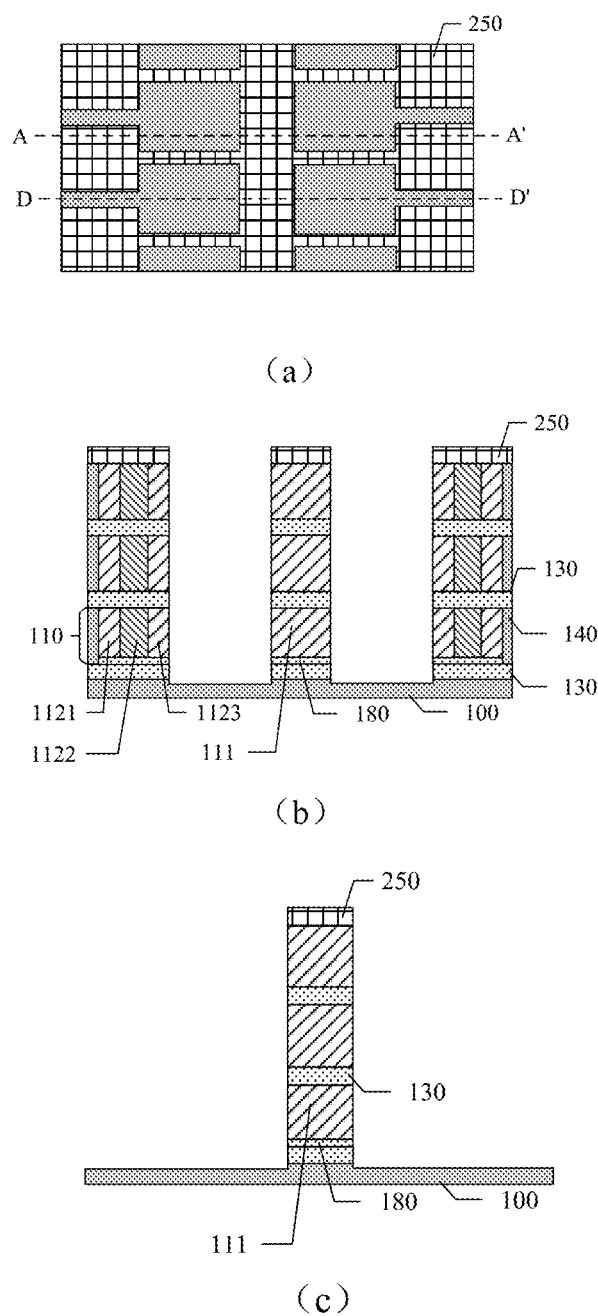
FIG. 33 is a scheme diagram of the structure obtained after forming a first trench provided by an embodiment of the disclosure.

Referring to FIG. 33, it shows a scheme diagram of the structure obtained after forming the first trench provided by the embodiment of the disclosure, in which (a) in FIG. 33 is a top view scheme diagram, (b) in FIG. 33 is a front view scheme diagram in the AA' direction in (a), and (c) in FIG. 33 is a front view scheme diagram in the DD' direction in (a). As shown in FIG. 33, the first photoresist layer 250 including at least one pair of first patterns is formed on the at least one layer of memory structure 110, and each pair of first patterns is symmetrically distributed along a bit line structure 111.

Figure 34:
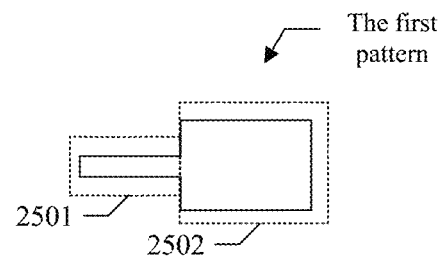
FIG. 34 is a structural scheme diagram of a first pattern provided by an embodiment of the disclosure.

For the first pattern, FIG. 34 shows a scheme diagram of the structure of the first pattern provided by the embodiments of the disclosure. As shown in FIG. 34, the first pattern includes the first shape 2501 and the second shape 2502.

The at least one layer of memory structure 110 is patterned with the first patterns as a mask. When the first shapes 2501 and the second shapes 2502 are transferred to the at least one layer of memory structure 110, the at least one layer of memory structure 110 and the at least one layer of isolation layer 130 can be etched to obtain at least one pair of first trenches.

Transferring the first shape 2501 forms the first portion of the first trench and transferring the second shape 2502 forms the second portion of the first trench. At this time the capacitor structure 112 is divided into multiple capacitor structures, and the second portion exposes the substrate 100, the sidewalls of the capacitor structures 112 and the sidewalls of the bit line structure 111.

During transferring the first patterns, as shown in FIG. 33, the substrate 100 may also be partially removed.

After forming the first trench, the first isolation structure is formed in the first portion of the first trench and an initial second isolation structure is formed in the second portion of the first trench.

Figure 35:
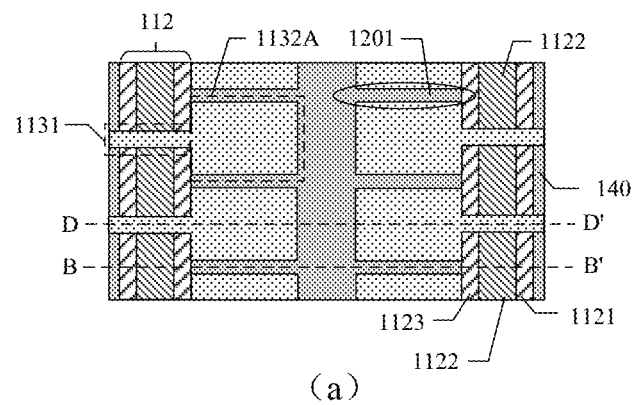
FIG. 35 is a scheme diagram of the structure obtained after forming a first isolation structure and an initial second isolation structure provided by an embodiment of the disclosure.
Figure 35:
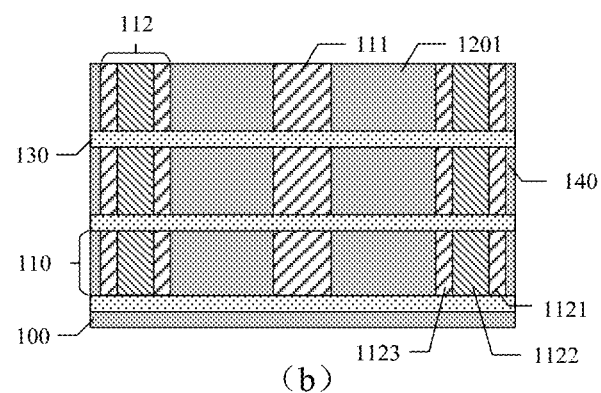
Figure 35:
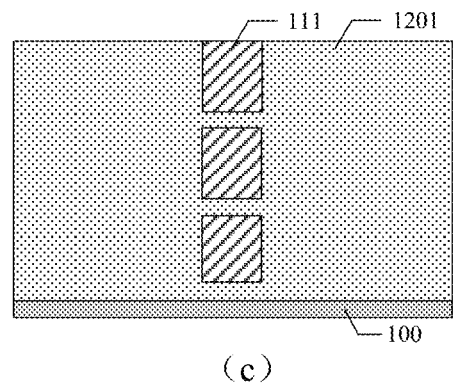

Referring to FIG. 35, it shows a scheme diagram of the structure obtained after forming the first isolation structures 1131 and the initial second isolation structures 1132A provided by the embodiment of the disclosure, in which (a) in FIG. 35 is a top view scheme diagram, (b) in FIG. 35 is a front view scheme diagram in the BB' direction in (a), and (c) in FIG. 35 is a front view scheme diagram in the DD' direction in (a). As shown in FIG. 35, the first isolation structures 1131 and the initial second isolation structures 1132A may be formed by depositing a low k material in the first portions and the second portions.

The first isolation structures 1131 isolate multiple capacitor structures 112 so that the multiple capacitor structures 112 can be formed in one layer of memory structure 110, thereby increasing the number of capacitor structures in the semiconductor structure.

Between two adjacent ones of the initial second isolation structures 1132A, an active layer including a channel layer 1201 and a source region and a drain region is formed. In the process of forming the first trench, part of the substrate layer 140 is removed, and the remaining substrate layer 140 is the channel layers 1201. In the top scheme diagram, the left and right sides of each channel layer 1201 include a source region and a drain region, respectively.

In some embodiments, multiple word line structures may include multiple gate structures, which may include multiple channel layers, multiple gate dielectric layers, and multiple gate conductive layers.

Forming multiple word line structures in at least one layer of memory structure may include the following operations.

A second patterning treatment is performed on the initial second isolation structures to form at least one pair of second trenches which expose part of multiple channel layers, and the remaining initial second isolation structures form second isolation structures.

Multiple gate dielectric layers are formed on the exposed portions of multiple channel layer surfaces; and Multiple gate conductive layers are formed on the surfaces of multiple gate dielectric layers, and the multiple gate dielectric layers and the multiple gate conductive layers are filled up the at least one pair of second trenches.

It should be noted, during forming the word line structures, at least one pair of second trenches may be formed in the initial second isolation structures 1132A, and then multiple gate dielectric layers may be formed on the surfaces of the channel layers exposed by the second trenches. At this time, the retained initial second isolation structures 1132A are the second isolation structures. In the remaining space of each second trench, the gate conductive layers are formed, so that the second trench is completely filled.

For the formation of the second trench, in some embodiments, forming at least one pair of second trenches by subjecting the initial second isolation structure to the second patterning process may include the following operations.

A second photoresist layer is formed on the at least one layer of memory structure and the initial second isolation structures, in which the second photoresist layer includes at least one pair of second patterns, each pair of the second patterns are symmetrically distributed along the bit line structure, and the second patterns are formed on the initial second isolation structures.

The initial second isolation structures are patterned with the at least one pair of second patterns as a mask, to form the at least one pair of second trenches.

The second photoresist layer is removed.

It should be noted that, during forming the second trenches, firstly, the second photoresist layer having the second patterns is formed, the second isolation structures are patterned with the second patterns as a mask to obtain the second trenches, and finally the second photoresist layer is removed.

Figure 36:
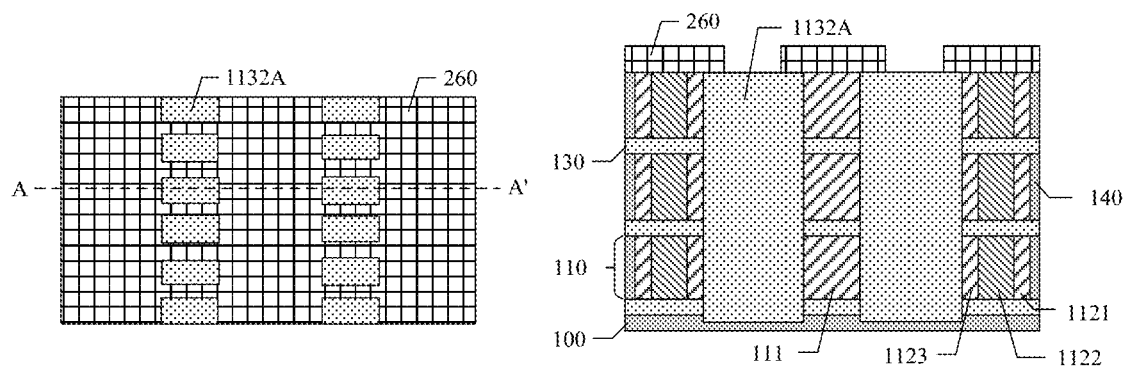
FIG. 36 is a scheme diagram of the structure obtained after forming a second photoresist layer provided by the embodiments of the disclosure.

Referring to FIG. 36, a scheme diagram of the structure obtained after forming a second photoresist layer 260 provided by the embodiment of the disclosure is shown, in which the left figure in FIG. 36 is a top view scheme diagram, and the right figure in FIG. 36 is a front view scheme diagram in the AA' direction of the left figure. As shown in FIG. 36, the second photoresist layer 260 has at least one pair of second patterns, each pair of second patterns symmetrically distributed along the bit line structure 111, and the second patterns are formed on the initial second isolation structures 1132A and exposes part of each initial second isolation structures 1132A.

Figure 37:
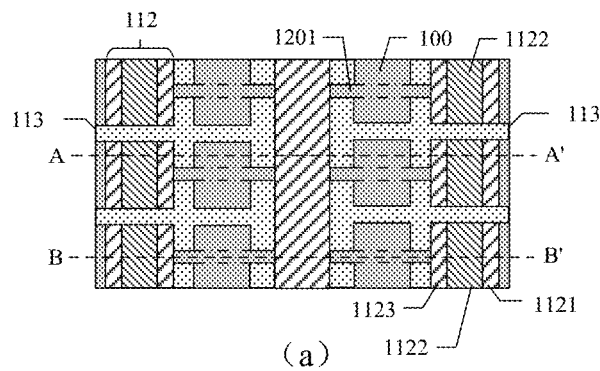
FIG. 37 is a scheme diagram of the structure obtained after forming second trenches provided by an embodiment of the disclosure.
Figure 37:
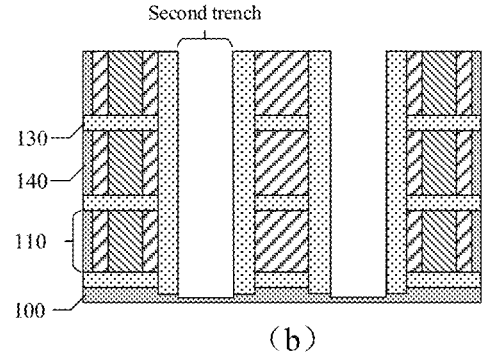
Figure 37:
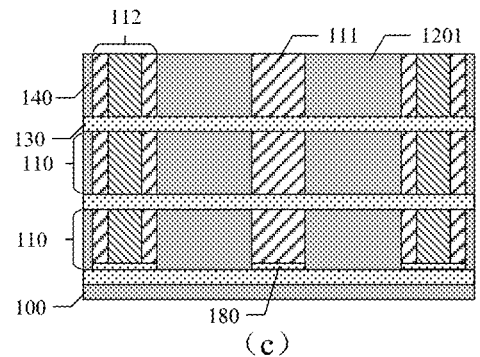

The second pattern is transferred to the initial second isolation structures 1132A, to obtain at least one pair of second trenches, where the initial second isolation structures 1132A may be etched to obtain the at least one pair of second trenches. Referring to FIG. 37, it shows a scheme diagram of structure obtained after forming the second trenches provided by the embodiment of the disclosure, in which (a) in FIG. 37 is a top view scheme diagram, (b) in FIG. 37 is a front view scheme diagram in the AA' direction of (a), and (c) in FIG. 37 is a front view scheme diagram in the BB' direction of (a). As shown in FIG. 37, after the second patterns are transferred and the second photoresist layer 260 is removed on the basis of FIG. 36, the formed at least one pair of second trenches expose the substrate 100, and the substrate 100 is partially removed. In the left figure, since the channel layers 1201 and the substrate 100 may be of the same material, they are separated by dot dash lines in order to distinguish them. The heights of the channel layers 1201 are the same as the heights of the capacitor structures 112 and the bit line structure 111, while the substrate 100 is located only at the bottom. Although the channel layers 1201 and the substrate 100 are represented by the same filling pattern from the top view, there are the second trenches above the substrate 100, in which no device is formed.

At this time, the remaining initial second isolation structure 1132A is the second isolation structures 1132. The specific shapes of the first isolation structures 1131 and the second isolation structures 1132 can be referred to the aforementioned FIGS. 6 and 7.

Figure 38:
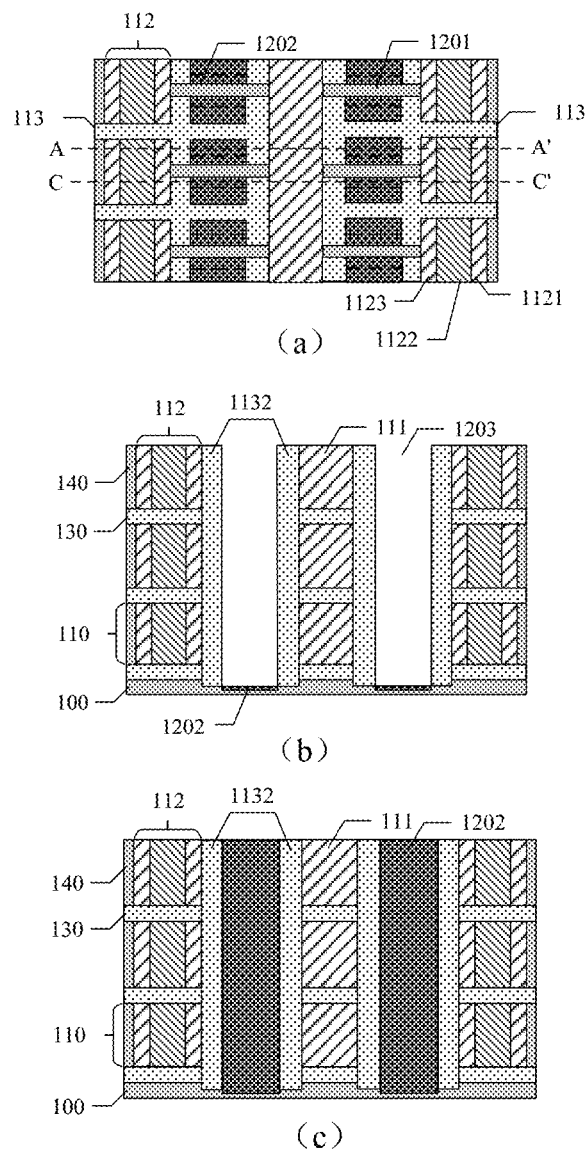
FIG. 38 is a scheme diagram of the structure obtained after forming gate dielectric layers provided by an embodiment of the disclosure.

After forming the at least one pair of second trenches, the sidewalls of multiple channel layers 1201 are exposed by the at least one pair of second trenches, and the multiple gate dielectric layers are formed on surfaces of the multiple channel layers 1201 exposed by the at least one pair of second trenches. Referring to FIG. 38, it shows a scheme diagram of the structure obtained after forming the gate dielectric layers 1202 provided by the embodiment of the disclosure, in which (a) in FIG. 38 is a top view scheme diagram, (b) in FIG. 38 is a front view scheme diagram in the AA' direction of (a), and (c) in FIG. 38 is a front view scheme diagram in the CC' direction of (a). As shown in FIG. 38, the gate dielectric layers 1202 are formed on the surfaces of the channel layers 1201 exposed by the second trenches, respectively. Since the gate dielectric layers 1202 may be formed by oxidation growth, the material of the substrate 100 and the channel layer 1201 may be the same, and therefore, the gate dielectric layers 1202 may also be formed on the surface of the substrate 100 exposed by the second trenches. The material of the gate dielectric layer 1202 may include silicon oxide.

It should also be noted that since the gate dielectric layers 1202 are formed not only on the sidewall surfaces of the channel layers 1201 but also on the upper surface of the substrate 100, the gate dielectric layer 1202 formed on the sidewall surfaces of the channel layers 1201 and the upper surface of the substrate 100 are not clearly distinguished from the top view. In order to show the difference between the two formed regions, as shown in (a) of FIG. 38, dotted lines are drawn in each gate dielectric layer 1202. The portion between a dotted line and a channel layer 1201 represents the gate dielectric layer 1202 formed on the sidewall surface of the channel layer 1201, and the other portion represents the gate dielectric layer 1202 formed on the upper surface of the substrate 100.

As shown in (b) of FIG. 38, the gate dielectric layers 1202 formed on the upper surface of the substrate 100 are located only in part of the upper surface of the substrate 100, i.e., the layer at the bottom of the second trenches. As shown in (c) of FIG. 38, the heights of the gate dielectric layers 1202 formed on the sidewall surfaces of the channel layers 1201 are flush with the heights of the second trenches.

Multiple gate conductive layers are formed on the surfaces of multiple gate dielectric layers 1202, i.e., in the vacant spaces of the at least one pair of second trenches, to obtain a semiconductor structure. The structural scheme diagram of the semiconductor structure is shown in the aforementioned FIGS. 1 to 5. In FIG. 1, the first isolation structure 1131 and the second isolation structure 1132 as a whole are referred to as the isolation structure 113. As shown in FIG. 1 and FIG. 2, the multiple gate conductive layers 1203 are formed on the surfaces of the multiple gate dielectric layers 1202, respectively, and the multiple gate dielectric layers 1202 and the multiple gate conductive layers 1203 fill up the at least one pair of second trenches. The gate conductive layers 1203 can be formed by depositing titanium nitride. When there are more gate conductive layers 1203 formed on the top of the semiconductor structure, the excess gate conductive layers 1203 can be removed by chemical mechanical polishing (CMP).

Thus, multiple channel layers 1201, multiple gate dielectric layers 1202, and multiple gate conductive layers 1203 may constitute multiple gate structures 1204 included in multiple word line structures 120, which may be denoted by the gate structures 1204 in the drawings of the embodiments of the disclosure.

The multiple capacitor structures 112 are formed by the isolation of the first isolation structures 1131, and the multiple word line structures 120 are formed by the isolation of the second isolation structures 1132, thereby effectively increasing the number of 1T1C elements in the semiconductor structure.

Details not disclosed in the embodiment may be understood with reference to the foregoing embodiments of the semiconductor structures.

The embodiments of the disclosure provide the preparation method of a semiconductor structure. A substrate is provided, at least one layer of memory structure is formed on the substrate, in which, each layer of the memory structure includes a bit line structure and multiple capacitor structures symmetrically distributed on both sides of the bit line structure, the multiple capacitor structures and the bit line structures extend in the first direction parallel to the substrate surface. Multiple word line structures are formed in the at least one layer of memory structure, and the multiple word line structures pass through the at least one layer of memory structure, and extend in the second direction perpendicular to the substrate surface. In this way, the semiconductor structure prepared by the method can include multiple layers of memory structures. In each layer of the memory structure, the capacitor structures are symmetrically distributed on both sides of the bit line structure, and the extending directions of the capacitor structures and the bit line structure are parallel to the substrate surface. In at least one layer of memory structure, the multiple word line structures are formed, and the extending directions of the multiple word line structures are perpendicular to the substrate plane. Therefore, a 3D stack is formed with the word line structures, the bit line structure and the capacitor structures to obtain a semiconductor structure having a 3D structure, and the number of 1T1C elements per unit area in the semiconductor structure is increased, thereby increasing the storage density of the semiconductor structure.

Figure 39:
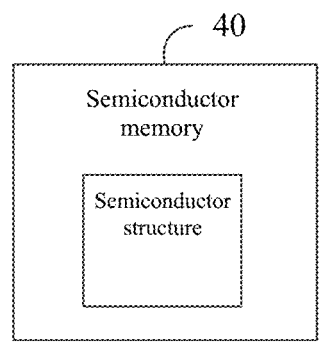
FIG. 39 is a structural scheme diagram of a semiconductor memory provided by an embodiment of the disclosure.

In yet another embodiment of the disclosure, referring to FIG. 39, a structural scheme diagram of a semiconductor memory 40 provided by an embodiment of the disclosure is shown. As shown in FIG. 39, the semiconductor memory 40 may include a semiconductor structure described in any of the foregoing embodiments.

Further the semiconductor memory 40 may include a DRAM.

The semiconductor memory 40, since it includes the semiconductor structure described in the aforementioned embodiments, its storage density can be significantly improved to meet a higher density storage requirement.

The above is only the preferred embodiments of the disclosure and is not intended to limit the scope of protection of the disclosure.

It should be noted that, in the disclosure, the terms "comprise", "include" or any other variation thereof are intended to encompass non-exclusive inclusion, so that a process, method, article or device, that includes a set of elements, includes not only those elements but also other elements that are not explicitly listed, or also includes elements inherent to such process, method, article or device. In the absence of further limitations, an element defined by the phrase "to include a/an . . . " does not preclude the existence of another identical element in the process, method, article or device including the element.

The serial numbers used in the above-mentioned embodiments of this disclosure are for description only, and do not represent the advantages and disadvantages of embodiment.

The methods disclosed in the embodiments of several methods provided in the disclosure can be arbitrarily combined without conflicts to obtain a new method embodiment.

The features disclosed in the embodiments of several products provided in the disclosure can be arbitrarily combined without conflicts to obtain new product embodiments.

The features disclosed in the embodiments of several methods or devices provided in the disclosure can be arbitrarily combined without conflicts to obtain a new method embodiment or device embodiment.

The above mentioned are only specific embodiments of the disclosure, but the protection scope of the disclosure is not limited thereto. Any skilled person familiar with the technical field can easily think of changes or substitutions within the technical scope of the disclosure, which are covered within the scope of protection of the disclosure. Therefore, the protection scope of this disclosure shall be the scope defined by the claims.

INDUSTRIAL PRACTICALITY

In the embodiments of the disclosure, the semiconductor structure includes: a substrate; at least one layer of memory structure formed on the substrate, in which, each layer of the memory structure includes a bit line structure and multiple capacitor structures symmetrically distributed on both sides of the bit line structure, in which multiple capacitor structures and the bit line structures extend along a first direction, and the first direction is parallel to the substrate surface; multiple word line structures formed in the at least one layer of memory structure, in which multiple word line structures pass through the at least one layer of memory structure, extend in a second direction, and the second direction is perpendicular to the substrate surface. Thus, multiple layers of memory structures may be included in the semiconductor structure. In each layer of the memory structure, multiple capacitor structures are symmetrically distributed on both sides of the bit line structure, and the extending directions of multiple capacitor structures and the bit line structure are parallel to the substrate surface. In at least one layer of memory structure, multiple word line structures are formed, and the extending direction of multiple word line structures is perpendicular to the substrate plane. Therefore, a 3D stack is formed with the word line structures, the bit line structure and the capacitor structures to obtain the semiconductor structure having a 3D structure, and the number of 1T1C elements per unit area in the semiconductor structure is increased, thereby increasing the storage density of the semiconductor structure.

The invention claimed is:
1. A semiconductor structure comprising:
a substrate;
at least one layer of memory structure formed on the substrate, wherein each layer of the memory structure comprises a bit line structure and a plurality of capacitor structures symmetrically distributed on both sides of the bit line structure, wherein the plurality of capacitor structures and the bit line structure extend in a first direction, which is parallel to the substrate surface; and
a plurality of word line structures formed in the at least one layer of memory structure and passing through the at least one layer of memory structure, wherein the plurality of word line structures extend in a second direction, which is perpendicular to the substrate surface;

wherein each of the capacitor structures includes an upper electrode, a dielectric layer and a lower electrode, and the dielectric layer is located between the upper electrode and the lower electrode;

wherein the semiconductor structure further comprises first isolation structures and second isolation structures formed in the at least one layer of memory structure, wherein the first isolation structures are configured to isolate the plurality of capacitor structures and the second isolation structures are configured to isolate the plurality of word line structures;

wherein the semiconductor structure further comprises at least one isolation layer for isolating each layer of memory structure.

2. The semiconductor structure according to claim 1, wherein each of the word line structures include a gate structure which includes a channel layer, a gate dielectric layer, and a gate conductive layer; wherein, the channel layer is electrically connected to a corresponding capacitor structure and the bit line structure, respectively, through a source or a drain;

the gate dielectric layer is located on partial surface of the channel layer;

the gate conductive layer is located on partial surface of the gate dielectric layer.

3. The semiconductor structure according to claim 2, wherein each of the gate structures comprises a gate-all-around structure.

4. The semiconductor structure according to claim 1, wherein a width of the bit line structure is smaller than a width of each capacitor structure.

5. A semiconductor memory, wherein the semiconductor memory at least comprises the semiconductor according to claim 1.

6. A method of preparing a semiconductor structure, comprising:

providing a substrate;

forming at least one layer of memory structure on the substrate, wherein each layer of the memory structure comprises a bit line structure and a plurality of capacitor structures symmetrically distributed on both sides of the bit line structure, wherein the plurality of capacitor structures and the bit line structure extend in a first direction, which is parallel to the substrate surface; and forming a plurality of word line structures in the at least one layer of memory structure, wherein the plurality of word line structures pass through the at least one layer of memory structure and extend in a second direction, which is perpendicular to the substrate surface;

wherein each of the capacitor structures includes an upper electrode, a dielectric layer and a lower electrode, and the dielectric layer is located between the upper electrode and the lower electrode;

wherein forming the plurality of word line structures in the at least one layer of memory structure comprises:

forming first isolation structures and second isolation structures in the at least one layer of memory structure, wherein the first isolation structures are configured to isolate the plurality of capacitor structures, and the second isolation structures are configured to isolate the plurality of word line structures;

wherein a number of the at least one layer of memory structure is N layers, and forming the at least one layer of memory structure on the substrate comprises:

forming an isolation layer on the substrate and forming one layer of the memory structure on the isolation layer; and repeating the steps of forming the isolation layer and one layer of the memory structure until N layers of the memory structures are formed.

7. The method according to claim 6, wherein forming the first isolation structures and the second isolation structures in the at least one layer of memory structure comprises:

performing a first patterning treatment on the at least one layer of memory structure to form at least one pair of first trenches, wherein each pair of the first trenches are symmetrically distributed along the bit line structure, and each of the first trenches comprises a first part and a second part, an active layer is formed between two adjacent ones of the second parts, and the active layer comprises a source region, a drain region and a channel layer; and forming a first isolation structure in the first portion and an initial second isolation structure is formed in the second portion.

8. The method according to claim 7, wherein performing the first patterning of the at least one layer of memory structure to form at least one pair of first trenches comprises:

forming a first photoresist layer on the at least one layer of memory structure, wherein the first photoresist layer comprises at least a pair of first patterns, each pair of the first patterns is symmetrically distributed along the bit line structure, and each first pattern comprises a first shape and a second shape; and patterning the at least one layer of memory structure with the at least one pair of first patterns as a mask, and forming the first portion and the second portion of each first trench, wherein the first portions isolate the same layer of the capacitor structure into a plurality of the capacitor structures, the second portions expose the substrate, sidewalls of the plurality of capacitor structures and sidewalls of the plurality of bit line structures; and removing the first photoresist layer.

9. The method according to claim 7, wherein each of the word line structures includes a gate structure, which includes a channel layer, a gate dielectric layer, and a gate conductive layer;

forming the plurality of word line structures in the at least one layer of memory structure comprises:

performing a second patterning treatment on the initial second isolation structure to form at least one pair of second trenches, each exposing part of each of channel layers, wherein the remaining initial second isolation structure forms the second isolation structures;

forming a plurality of gate dielectric layers, each on the exposed portion of the surface of each channel layer; and forming a plurality of gate conductive layers, each on the surface of each gate dielectric layer, and the plurality of gate dielectric layers and the plurality of gate conductive layers fill up the at least one pair of second trenches.

10. The method according to claim 9, wherein performing the second patterning of the initial second isolation structures to form at least one pair of second trenches comprises:

forming a second photoresist layer on the at least one layer of memory structure and the initial second isolation structures, wherein the second photoresist layer includes at least one pair of second patterns, each pair of the second patterns are symmetrically distributed along the bit line structure, and the second patterns are formed on the initial second isolation structure;

patterning the initial second isolation structures with the at least one pair of second patterns as a mask to form the at least one pair of second trenches; and removing the second photoresist layer.

11. The method according to claim 6, wherein forming the isolation layer on the substrate and forming one layer of the memory structure on the isolation layer comprises:

forming the isolation layer and a substrate layer on the substrate;

forming a first mask layer and a second mask layer on the substrate layer;

performing a third patterning process on the substrate layer, the first mask layer and the second mask layer to form at least one bit line trench and at least one pair of capacitor trenches, wherein the at least one bit line trench and the at least one pair of capacitor trenches expose the isolation layer, and each pair of capacitor trenches are symmetrically distributed on both sides of the bit line trench, a width of the bit line trench is smaller than a width of the capacitor trenches;

forming the bit line structure in the bit line trench and forming the capacitor structure in each capacitor trench, and a top surface of the bit line structure and a top surfaces of the capacitor structures are in the same plane; and removing the substrate layer, the first mask layer and the second mask layer on the top surface of the bit line structure and the top surfaces of the capacitor structures to form one layer of the memory structure.

12. The method according to claim 11, wherein forming the bit line structure within the bit line trench and forming the capacitor structure within each capacitor trench comprises:

filling a conductive layer in the at least one bit line trench and the at least one pair of capacitor trenches, wherein the conductive layer is filled up the bit line trench, and the conductive layer formed in each capacitor trench comprises an upper electrode and a lower electrode, and a dielectric trench exists between the upper electrode and the lower electrode; and forming a dielectric layer in the dielectric trench, and a top surface of the dielectric layer and a top surface of the conductive layer are in the same plane, wherein the bit line structure is composed of the conductive layer in the bit line trench, and each capacitor structure is composed of the upper electrode, the lower electrode and the dielectric layer in each capacitor trench.

13. The method according to claim 11, wherein forming the bit line structure within the bit line trench and forming the capacitor structure within each capacitor trench comprises:

forming third isolation structures on the second mask layer and the isolation layer;

forming a conductive layer in the at least one bit line trench, the at least one pair of capacitor trenches and on surfaces of the third isolation structures, and the conductive layer formed in each capacitor trench comprises an upper electrode and a lower electrode, and a dielectric trench exists between the upper electrode and the lower electrode; and forming a dielectric layer in the dielectric trench, and a top surface of the dielectric layer and a top surface of the conductive layer are in the same plane, wherein, the bit line structure is composed of the conductive layer in the bit line trench, and each capacitor structure is composed of the upper electrode, the lower electrode and the dielectric layer in each capacitor trench.

14. The method according to claim 12, wherein before removing the substrate layer, the first mask layer and the second mask layer on the top surface of the bit line structure and the top surfaces of the capacitor structures to form one layer of the memory structure, the method further comprises:

removing part of the conductive layer within the bit line trench, to make the conductive layer of the bit line structure and the conductive layer of the capacitor structure are in a same plane.

\* \* \* \* \*